(12) United States Patent
Ito et al.

(10) Patent No.: US 7,998,795 B2
(45) Date of Patent: *Aug. 16, 2011

(54) METHOD OF MANUFACTURING A SEMICONDUCTOR DEVICE INCLUDING PLURAL SEMICONDUCTOR CHIPS

(75) Inventors: Fujio Ito, Hanno (JP); Hiromichi Suzuki, Tokyo (JP); Akihiko Kameoka, Ogose (JP); Noriaki Sakamoto, Kodaira (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

This patent is subject to a terminal disclaimer.

(21) Appl. No.: 12/817,832

(22) Filed: Jun. 17, 2010

(65) Prior Publication Data

US 2010/0255639 A1    Oct. 7, 2010

Related U.S. Application Data

(63) Continuation of application No. 12/263,696, filed on Nov. 3, 2008, now Pat. No. 7,772,044, which is a continuation of application No. 11/580,904, filed on Oct. 16, 2006, now Pat. No. 7,466,024, which is a continuation of application No. 11/106,678, filed on Apr. 15, 2005, now abandoned.

(30) Foreign Application Priority Data

Apr. 16, 2004  (JP) ................................ 2004-121046

(51) Int. Cl.
H01L 21/44 (2006.01)
H01L 21/48 (2006.01)

(52) U.S. Cl. ........ 438/123; 438/124; 438/125; 257/676; 257/724

(58) Field of Classification Search .......... 438/123–125, 438/107; 257/666, 676, 706, 724, E23.037, 257/E23.052
See application file for complete search history.

(56) References Cited

U.S. PATENT DOCUMENTS

| | | | |
|---|---|---|---|
| 5,352,632 | A | 10/1994 | Sawaya |
| 5,781,047 | A | 7/1998 | Shreve et al. |
| 5,808,877 | A | 9/1998 | Jeong et al. |
| 6,081,978 | A | 7/2000 | Utsumi et al. |
| 6,300,146 | B1 | 10/2001 | Thierry |

(Continued)

FOREIGN PATENT DOCUMENTS

JP    06-151685    5/1994

(Continued)

Primary Examiner — Theresa T Doan
(74) Attorney, Agent, or Firm — Antonelli, Terry, Stout & Kraus, LLP.

(57) ABSTRACT

A method for manufacturing a semiconductor device includes mounting a first chip over a first area of a chip mounting section of a lead frame and mounting a second chip over a second area of the chip mounting section, wherein the second area is adjacent to the first area via the slit. The chip mounting section is disposed on a flat heating jig. First pads of the first chip are connected with second pads of the second chip via first wires, respectively, and the first pads are connected with leads of the lead frame via second wires, respectively. the first chip, the second chip, the first wires and the second wires are sealed with a resin such that a part of each of the leads is exposed from the resin, and each of the leads is then separated from the lead frame.

1 Claim, 23 Drawing Sheets

U.S. PATENT DOCUMENTS

| | | |
|---|---|---|
| 6,602,735 B2 | 8/2003 | Shu |
| 6,638,790 B2 | 10/2003 | Minamio et al. |
| 6,768,186 B2 | 7/2004 | Letterman et al. |
| 7,466,024 B2 | 12/2008 | Ito et al. |
| 7,772,044 B2 * | 8/2010 | Ito et al. .................. 438/123 |
| 2003/0102556 A1 | 6/2003 | Moriguchi et al. |

FOREIGN PATENT DOCUMENTS

| | | |
|---|---|---|
| JP | 09-160802 | 6/1997 |
| JP | 10-123212 | 5/1998 |

* cited by examiner

METHOD OF MANUFACTURING A SEMICONDUCTOR DEVICE INCLUDING PLURAL SEMICONDUCTOR CHIPS

CROSS-REFERENCE TO RELATED APPLICATION

The present application is a Continuation application of U.S. application Ser. No. 12/263,696, filed Nov. 3, 2008, now U.S. Pat. No. 7,772,044, which, in turn, is a continuation of Ser. No. 11/580,904, filed Oct. 16, 2006 (now U.S. Pat. No. 7,466,024), which, in turn is a continuation of U.S. application Ser. No. 11/106,678, filed on Apr. 15, 2005 (now abandoned), which claims priority from Japanese patent application No. 2004-121046, filed on Apr. 16, 2004, the contents of which are hereby incorporated by reference into this application.

BACKGROUND OF THE INVENTION

The present invention relates in general to a semiconductor device and to a method of manufacture thereof; and, more particularly, the invention relates to a technique to be applied to a semiconductor device having a plurality of semiconductor chips and a manufacturing method of manufacture thereof.

Further, the present invention relates to a semiconductor device, and particularly to a technique to be applied to a test on a semiconductor device, such as an SIP (System In Package) or the like, in which a plurality of semiconductor chips are mounted to a single package.

In a conventional multi-chip package (semiconductor device) having a plurality of semiconductor elements (semiconductor chips), some of the leads are extended from one edge of a semiconductor element to the other edge thereof without making contact with a main surface of at least one semiconductor element. Thus, the leads and the semiconductor elements are solid-crossed. Internal electrodes of the plural semiconductor elements are connected to common leads by bonding wires. Reference is made, for example, to Japanese Unexamined Patent Publication No. Hei 6 (1994)-151685 (FIG. 1).

Upon testing of a semiconductor device such as an SIP, there is a need to perform leakage tests on input/output terminals of a plurality semiconductor chips (hereinafter simply called "chips") that are mounted to the SIP, for example, even on terminals which do not need to be output to the outside of the SIP. Thus, all terminals used for connecting among chips mounted to the SIP have heretofore been extended to the outside of the SIP to ensure easiness or serviceability of such a post-assembly test.

Incidentally, Japanese Unexamined Patent Publication No. Hei 9 (1997)-160802 discloses a means for testing each memory in an SIP containing a CPU and a memory. Further, Japanese Unexamined Patent Publication No. Hei 10 (1998)-123212 discloses a means for detecting a leakage current in a non-contact manner with respect to each input/output terminal.

SUMMARY OF THE INVENTION

As one example of a multi-chip package (semiconductor device) having a plurality of semiconductor chips, there is a semiconductor device called a "SIP" which includes a semiconductor chip (hereinafter called a "microcomputer chip") having a computation processing function and a semiconductor chip (hereinafter called also memory chip") having a memory circuit.

With respect to a SIP, there is a substrate type which is in the mainstream in terms of the high degree of freedom of wire routing that is provides. However, the substrate type of SIP is high in cost.

Thus, the present inventors have discussed the possible use of a frame type SIP which is assembled using a lead frame to reduce the cost. However, it was found that the frame type SIP has an inherent problem in that, when the number of pins is increased, a semiconductor device in the SIP becomes large in size as compared with the substrate type of SIP.

Incidentally, although a frame type multi-chip package has been described in the Japanese Unexamined Patent Publication No. Hei 6 (1994)-151685, the technique of miniaturizing a multi-pin type of semiconductor device has not been described in this publication.

Further, the present inventors have discussed the technique used for testing a semiconductor device, such as the semiconductor device included in an SIP. As a result, the following considerations became apparent.

In an SIP product, for example, chip-to-chip connecting terminals that are unnecessary for certain customers have also been extended to the outside of the SIP in terms of providing easiness of a post-assembly test. Therefore, there has been a tendency to increase the number of terminals (pins), which increases the package size.

An object of the present invention is to provide a semiconductor device in which it is possible to provide a multi-pin configuration and realize a cost reduction, and to a method of manufacture thereof.

Another object of the present invention is to provide a semiconductor device in which it is possible to effect miniaturization and realize a cost reduction, and to a method of manufacture thereof.

A further object of the present invention is to provide a test technique for a semiconductor device in which the number of external terminals is reduced to reduce the package size, such as in an SIP, in which a plurality of semiconductor chips are mounted to a single package.

Yet another object of the present invention is to provide a semiconductor device in which it is possible to achieve a thinning of the device, and to a method of manufacture thereof.

The above, other objects and novel features of the present invention will become apparent from the description provided in the present specification and the accompanying drawings.

Representative aspects of the invention disclosed in the present application will be explained in brief as follows:

The present invention provides a semiconductor device comprising a first semiconductor chip having a semiconductor element and a plurality of electrodes formed over a main surface thereof, a second semiconductor chip which has a semiconductor element and a plurality of electrodes formed over a main surface thereof and which is disposed side by side laterally relative to the first semiconductor chip and thinner than the first semiconductor chip, a first chip mounting section connected to the first semiconductor chip, a second chip mounting section connected to the second semiconductor chip, a plurality of leads disposed around the first and second semiconductor chips, a plurality of conductive first wires which electrically connect the electrodes of the first semiconductor chip and the electrodes of the second semiconductor chip, respectively, a plurality of conductive second wires which electrically connect the electrodes of the first semiconductor chip and the leads, respectively, and which are disposed so as to jump over the second semiconductor chip and are formed with loops at positions higher than the loops of the first wires, and an encapsulating body which resin-seals the first and second semiconductor chips, and the plurality of first and second wires.

The present invention provides a semiconductor device comprising a first semiconductor chip having a semiconductor element and a plurality of electrodes formed over a main surface thereof, a second semiconductor chip having a semiconductor element and a plurality of electrodes formed over a main surface thereof and which is disposed side by side laterally relative to the first semiconductor chip, a first chip mounting section connected to the first semiconductor chip, a second chip mounting section connected to the second semiconductor chip and formed so as to be thinner than the first chip mounting section, a plurality of leads disposed around the first and second semiconductor chips, a plurality of conductive first wires which electrically connect the electrodes of the first semiconductor chip and the electrodes of the second semiconductor chip, respectively, a plurality of conductive second wires which electrically connect the electrodes of the first semiconductor chip and the leads respectively, and which are disposed so as to jump over the second semiconductor chip and are formed with loops at positions higher than the loops of the first wires, and an encapsulating body which resin-seals the first and second semiconductor chips, and the plurality of first and second wires.

The present invention provides a semiconductor device comprising a first semiconductor chip having a semiconductor element and a plurality of electrodes formed over a main surface thereof, a second semiconductor chip having a semiconductor element and a plurality of electrodes formed over a main surface thereof and which is disposed side by side laterally relative to the first semiconductor chip, a first chip mounting section disposed below the plurality of electrodes of the first semiconductor chip in association with the plurality of electrodes thereof and are connected to the first semiconductor chip, a second chip mounting section disposed below the plurality of electrodes of the second semiconductor chip in association with the plurality of electrodes thereof and are connected to the second semiconductor chip, a plurality of leads disposed around the first and second semiconductor chips, a plurality of conductive first wires which electrically connect the electrodes of the first semiconductor chip and the electrodes of the second semiconductor chip, respectively, a plurality of conductive second wires which electrically connect the electrodes of the first semiconductor chip and the leads, respectively, and an encapsulating body which resin-seals the first and second semiconductor chips, and the plurality of first and second wires, wherein part of a back surface of the first semiconductor chip and part of a back surface of the second semiconductor chip are respectively adhered to part of the encapsulating body.

The present invention provides a semiconductor device comprising a first semiconductor chip having a semiconductor element and a plurality of electrodes formed over a main surface thereof, a second semiconductor chip which has a semiconductor element and a plurality of electrodes formed over a main surface thereof and which is disposed side by side laterally the first semiconductor chip and has a plane shape formed in a rectangular form, a first chip mounting section connected to the first semiconductor chip, a second chip mounting section connected to the second semiconductor chip, a plurality of leads disposed around the first and second semiconductor chips, a plurality of conductive first wires which electrically connect the electrodes of the first semiconductor chip and the electrodes of the second semiconductor chip, respectively, a plurality of conductive second wires which electrically connect the electrodes of the first semiconductor chip and the leads, respectively, and an encapsulating body which resin-seals the first and second semiconductor chips, and the plurality of first and second wires, wherein the relationship between a distance P in a direction parallel to the direction of a short side of the second semiconductor chip between a center, in a plane direction, of the first semiconductor chip and a center, in a plane direction, of the semiconductor device, and a length C of the short side of the second semiconductor chip is given as $P<(C/2)$.

The present invention provides a method of manufacturing a semiconductor device, comprising the steps of preparing a lead frame which has a chip mounting section comprising a first chip mounting section and a second chip mounting section disposed alongside of the first chip mounting section and which has a plurality of leads disposed around the chip mounting section; mounting a first semiconductor chip over the first chip mounting section in such a manner that a plurality of electrodes of the first semiconductor chip are disposed over the first chip mounting section, and mounting a second semiconductor chip over the second chip mounting section in such a manner that a plurality of electrodes of the second semiconductor chip are disposed over the second chip mounting section; in a state in which the first chip mounting section and second chip mounting section of the lead frame are supported by the same flat surface of a heating jig, electrically connecting the plurality of electrodes of the first semiconductor chip and the plurality of electrodes of the second semiconductor chip by a plurality of conductive first wires, respectively, and electrically connecting the plurality of electrodes of the first semiconductor chip and the plurality of leads by a plurality of conductive second wires, respectively; resin-sealing the first and second semiconductor chips, the chip mounting section and the plurality of first and second wires to form an encapsulating body; and separating the plurality of leads from the lead frame to bring the same into fractionization.

The present invention provides a method of manufacturing a semiconductor device, comprising the steps of preparing a lead frame which has a chip mounting section comprising a first chip mounting section and a second chip mounting section disposed alongside of the first chip mounting section and which has a plurality of leads disposed around the chip mounting section; mounting a first semiconductor chip over the first chip mounting section that is smaller than a back surface of the first semiconductor chip, and mounting a second semiconductor chip over the second chip mounting section in such a manner that a plurality of electrodes of the second semiconductor chip are disposed over the second chip mounting section; in a state in which the back surface of the first semiconductor chip is vacuum-adsorbed to support lower portions of the plurality of electrodes of the first semiconductor chip by a heating jig, and the second chip mounting section of the lead frame is supported by the heating jig, electrically connecting the plurality of electrodes of the first semiconductor chip and the plurality of electrodes of the second semiconductor chip by a plurality of conductive first wires, respectively, and electrically connecting the plurality of electrodes of the first semiconductor chip and the plurality of leads by a plurality of conductive second wires, respectively; resin-sealing the first and second semiconductor chips, the chip mounting section and the plurality of first and second wires to form an encapsulating body; and separating the plurality of leads from the lead frame to bring the same into fractionization.

Advantageous effects obtained by representative features of the invention disclosed in the present application will be described in brief as follows:

(1) In a semiconductor device in which a first semiconductor chip and a second semiconductor chip are disposed laterally side by side, electrodes of the first semiconductor chip and electrodes of the second semiconductor chip adjacent thereto are connected by first wires, respectively. Further, the electrodes of the first semiconductor chip and their corresponding inner leads are connected by second wires disposed so as to bridge or jump over the second semiconductor chip. Therefore, when the second semiconductor chip is a memory chip, an interface circuit for a memory bus is connected only between the chips by the first wires, without connecting to external terminals and is closed within a package. Thus, since the interface circuit for the memory bus is not connected to the external terminals, pins can be utilized for other functions, and, hence, a multi-pin configuration can be achieved. Further, the cost of the semiconductor device can be reduced owing to the adoption of a frame type package.

(2) A test circuit for each memory chip is provided within a system chip. Consequently, there is no need to extend terminals for testing each memory chip to the outside of an SIP. It is therefore possible to reduce the number of terminals and produce a package of smaller size.

(3) In an SIP product, a small-scale change (change in input/output buffer with a control signal input) is effected on an input buffer or an output buffer that already exists for terminal leakage measurement. As a result, the number of terminals can be reduced.

(4) A small-sized circuit (input/output buffer with a control signal input) is provided for terminal leakage measurement to thereby realize a reduction in the number of terminals. As a result, the package size can be further reduced, whereby a reduction in cost can be realized.

DETAILED DESCRIPTION OF THE PREFERRED EMBODIMENTS

Figure 1:
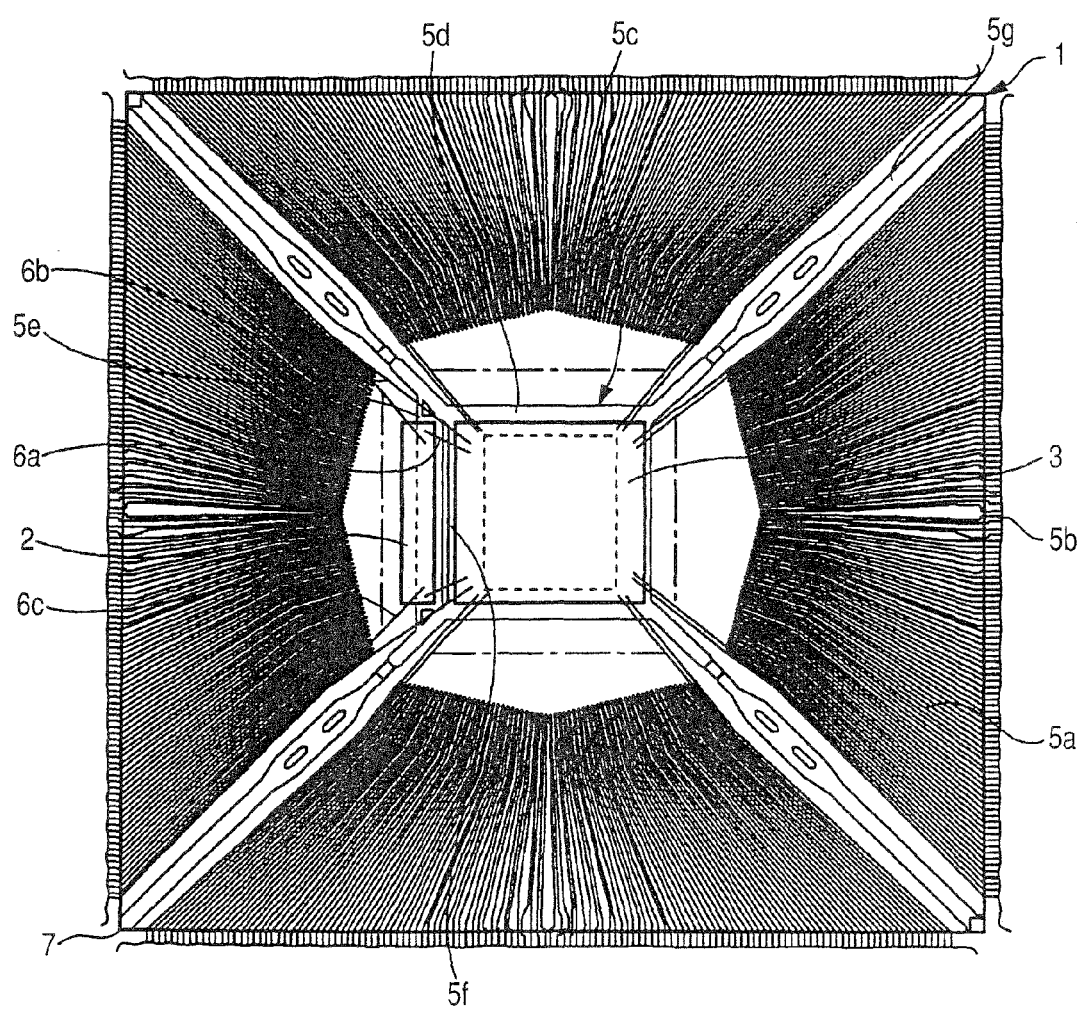
FIG. 1 is a plan view showing one example of the structure of a semiconductor device according to a first embodiment of the present invention, as seen through a sealing body.

The description of the same or similar portions will not be repeated in the following specification unless especially necessary.

Further, whenever circumstances require it, for convenience, in the following description of the embodiments, the subject matter of the invention may be divided into a plurality of sections or embodiments. However, unless specified in particular, they are not irrelevant to one another but have to do with modifications, details and supplementary explanations of some or all of the others.

When reference is made to a number of elements or the like (including the number of pieces, numerical values, quantity, range, etc.) in the following description of the embodiments, the number thereof is not limited to a specific number and may be greater than, or less than or equal to the specific number, unless specified in particular and definitely limited to the specific number in principle.

Preferred embodiments of the present invention will be described in detail with reference to the accompanying drawings. In this description, components or members each having the same function in all of the drawings are respectively given the same reference numerals, and a repetitive description thereof is omitted.

First Preferred Embodiment

FIGS. 1 through 18 illustrate the various features of one example of a semiconductor device according to a first embodiment of the present invention.

Figure 2:
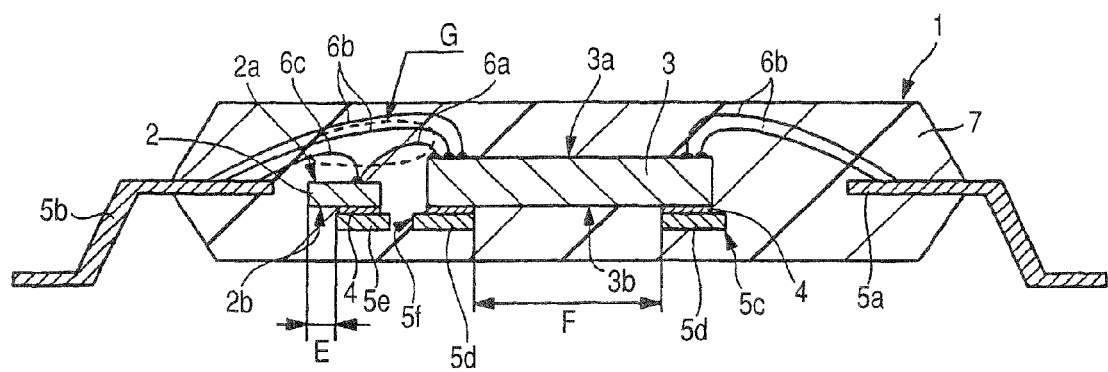
FIG. 2 is a cross-sectional view illustrating one example of the structure of the semiconductor device shown in FIG. 1.

The semiconductor device according to the first embodiment, as shown in FIGS. 1 and 2, is in the form of a multi-chip package having a plurality of semiconductor chips. In the present embodiment, an SIP 1, in which a semiconductor chip having a memory circuit and a semiconductor chip that controls it and has a computation processing function are incorporated, will be taken as one example to be described.

Figure 4:
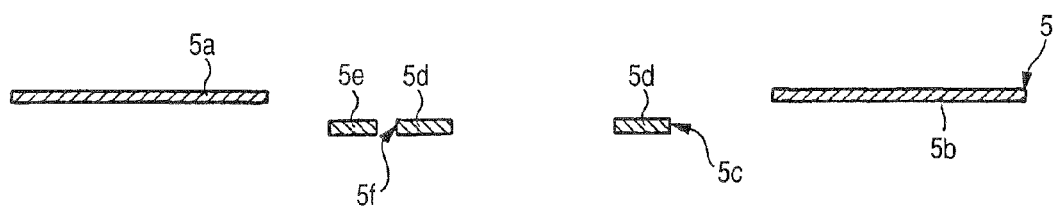
FIG. 4 is a cross-sectional view showing one example of the structure of a lead frame used in an assembly of the semiconductor device shown in FIG. 1.

Incidentally, the SIP 1 according to the present embodiment is a resin molded type semiconductor package of the frame type that it is assembled using a lead frame 5, as shown in FIG. 4. As to the SIP 1, a description will be made, as one example, of a case in which there are two semiconductor chips, including a microcomputer chip 3 corresponding to a first semiconductor chip (called a "first semiconductor chip, system chip or ASIC") provided with a computation processing function, and an SDRAM (Synchronous Dynamic Random Access Memory) 2 corresponding to a second semiconductor chip (called a "second semiconductor chip") having a memory circuit.

The configuration of the SIP 1 shown in FIGS. 1 and 2 will be explained. The SIP 1 comprises: a microcomputer chip 3 corresponding to a first semiconductor chip having at least one semiconductor element and a plurality of pads (electrodes) 3c disposed over its main surface 3a; an SDRAM 2 (memory chip) corresponding to a second semiconductor chip, which has at least one semiconductor element and a plurality of pads (electrodes) 2c disposed over its main surface 2a, and which is disposed alongside the microcomputer chip 3 and in thinner than the microcomputer chip 3; a tub 5 corresponding to a chip mounting section, which is provided with a first chip mounting section 5d and a second chip mounting section 5e; inner leads 5a corresponding to plural leads, which are disposed around the microcomputer chip 3 and the SDRAM 2; a plurality of outer leads 5b corresponding to external terminals, which are connected integrally with their corresponding inner leads 5a and are exposed to the outside; a plurality of conductive first wires 6a, which electrically connect the pads 3c of the microcomputer chip 3 and the pads 2c of the SDRAM 2 corresponding thereto, respectively; a plurality of conductive second wires 6b, which electrically connect the pads 3c of the microcomputer chip 3 and the inner leads 5a corresponding thereto, respectively, and which are disposed so as to bridge or jump across the SDRAM 2 and have loops formed at positions higher than the loops of the first wires 6a; and a sealing or encapsulating body 7, which resin molds or seals the microcomputer 3, the SDRAM 3, the plurality of first wires 6a and the plurality of second wires 6b.

Further, the respective outer leads 5b, respectively formed so as to be connected integrally with the inner leads 5a, protrude to the outside from the respective four sides of the encapsulating body 7. As shown in FIG. 2, the outer leads 5b are formed so as to be bent in gull-wing form.

Thus, the SIP 1 according to the present embodiment is identical to a QFP (Quad Flat Package) in its outward appearance and shape. As shown in FIG. 1, it corresponds to a multi-pin type package in which the number of pins is 200 or more, for example.

Incidentally, the tub 5c corresponding to the chip mounting section comprises a first chip mounting section 5d connected to the microcomputer chip 3 and a second chip mounting section 5e connected to the SDRAM 2. The first chip mounting section 5d and the second chip mounting section 5e are integrally formed to provide the tub 5c. The first chip mounting section 5d and the second chip mounting section 5e have chip support surfaces that are flush with each other. Further, the tub 5c is coupled to suspension leads 5g disposed at its four corners.

The first chip mounting section 5d is shaped in the form of a frame. Since the plurality of pads 3c are disposed along peripheral edge portions on the four sides of the main surface 3a of the microcomputer chip 3 in the microcomputer chip 3, the frame-shaped first chip mounting section 5d is disposed underneath those pads in a form corresponding to the arrays of the pads 3c at the four sides.

On the other hand, the second chip mounting section 5e is shaped in a rectangular form. The second chip mounting section 5e is disposed below the pads 2c in a form corresponding to an array of the plural pads 2c formed in the main surface 2a of the SDRAM 2.

Figure 3:
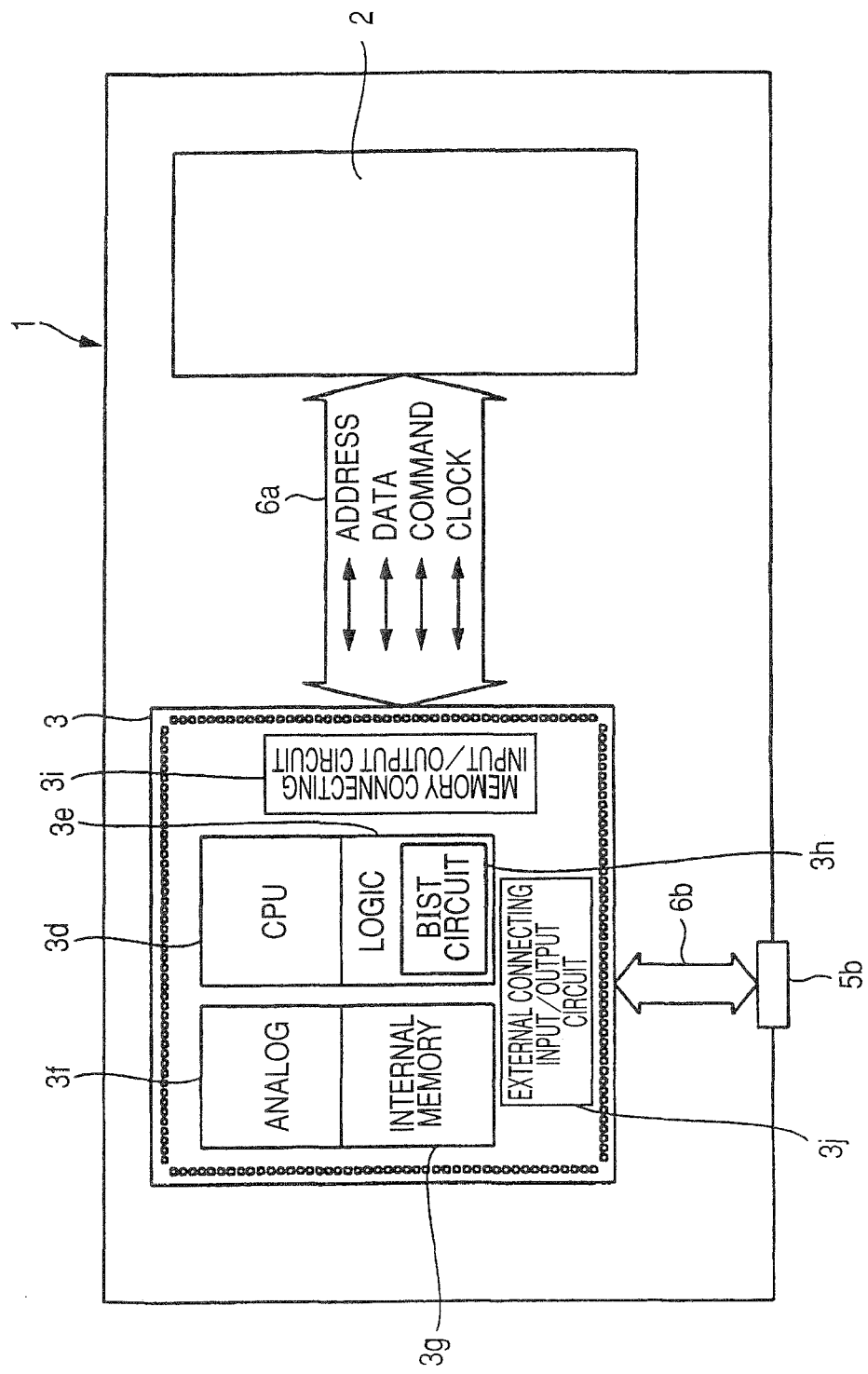
FIG. 3 is a block diagram depicting one example of a system of the semiconductor device shown in FIG. 1.

As shown in FIG. 3, respective circuits, such as a CPU (Central Processing Unit) 3d, a logic circuit 3e, an analog circuit 3f, an internal memory 3g, etc., and interface circuits, such as a memory connecting input/output circuit 3i and an external connecting input/output circuit 3j, are incorporated into the microcomputer chip 3 of the SIP 1. The memory connecting input/output circuit 3i is connected to the SDRAM 2 through respective first wires 6a. The external connecting input/output circuit 3j is electrically connected to the inner leads 5a through respective second wires 6b. These inner leads 5a are connected to the outer leads 5b.

In the SIP 1 according to the present embodiment, the microcomputer chip 3 and the SDRAM 2 are disposed laterally side by side. At this time, the arrays of the pads 3c of the microcomputer chip 3 corresponding to these pads 2c are mutually disposed so as to be aligned adjacent to the array of the pads 2c of the SDRAM 2. Consequently, the pads 3c of the microcomputer chip 3 and the pads 2c of the SDRAM 2 adjacent thereto are connected to one another by the first wires 6a.

In this state, signals, such as addresses, data, commands and a clock are transferred between both chips through the respective first wires 6a. However, the main pads 2c (except for ones for a power supply and GND) of the SDRAM 2 and the first wires 6a are not electrically connected to the outer leads 5b. That is, a structure is adopted in which memory buses connected to the SDRAM 2 are closed inside the package and are not exposed to the outside as wirings or terminals.

However, the pads 2c, for the power supply and GND, of the SDRAM 2 are connected to their corresponding inner leads 5a through third wires 6c. Further, the outer leads 5b, which are connected integrally with the inner leads 5a, are formed as external terminals. A power supply potential and a GND potential are externally applied to the SDRAM 2 through the third wires 6c.

The logic circuit 3e of the microcomputer chip 3 is provided with a BIST (Built In Self Test) circuit (test circuit) 3h capable of testing a memory circuit provided outside the microcomputer chip 3. That is, the logic circuit 3e of the microcomputer chip 3 is provided with the BIST circuit 3h, which is capable of testing the memory circuit of the SDRAM 2. The BIST circuit 3h of the microcomputer chip 3 and the pads 2c of the SDRAM 2 corresponding thereto are electrically connected by the first wires 6a.

Consequently, the SDRAM 2 can be tested under control from the microcomputer chip 3.

In the SIP 1 according to the present embodiment, as described above, the microcomputer chip 3 and the SDRAM 2 are disposed laterally side by side in such a manner that the plurality of pads 2c connected to the memory connecting input/output circuit 3i corresponding to an interface circuit for each memory bus of the SDRAM 2, and the pads 3c of the microcomputer chip 3 corresponding to the pads 2c are disposed adjacent to one another. Thus, the pads 3c of the microcomputer chip 3 and the pads 2c of the SDRAM 2 are connected to one another by means of the first wires 6a. Further, other pads 3c disposed adjacent to the SDRAM 2, of the microcomputer chip 3, and the inner leads 5a corresponding to the pads 3c are disposed such that the second wires 6b bridge or jump across the SDRAM 2, and then are connected to one another by the second wires 6b. The memory connecting input/output circuit 3i of the SDRAM 2 is connected only between the chips by the first wires 6a without connecting to the external terminals and is closed within the package. That is, since the memory connecting input/output circuit 3i corresponding to the interface circuit for each memory bus is not connected to the external terminals, the pins otherwise provided therefore can be utilized for other functions correspondingly. Even when the number of external terminals is limited due to a restriction on the size of the semiconductor device, more multi-functioning can be achieved. Further, the SIPI is one of a type that is assembled using the lead frame 5. Owing to this use of the frame type, the cost of the SIP 1 can be reduced.

When the SIP 1 is not intended for multi-functioning, the memory connecting input/output circuit 3i of the SDRAM 2 is not connected to the external terminals. Correspondingly, the number of pins (number of external terminals) is reduced so that the SIP 1 can be miniaturized.

Further, the second wires 6b are disposed so as to bridge or jump across the SDRAM 2. Thus, since the pads 3c of the microcomputer chip 3 and the inner leads 5a can be connected by the second wires 6b, the outer leads 5b connected to these inner leads 5a also can be effectively utilized. As a result, the performance of the SIP 1 can be enhanced.

Since the SDRAM 2 is thinner than the microcomputer chip 3, as shown in FIG. 2, the height of each of the pads 2c of the SDRAM 2 becomes lower than that of each of the pads 3c of the microcomputer chip 3, thereby causing a difference in height between both pads. Thus, when the second wires 6b for connecting the microcomputer chip 3 and the inner leads 5a bridge or jump over the SDRAM 2, the loops of the second wires 6b can be formed at positions sufficiently higher than the loops of the first wires 6a.

Thus, as indicated by a portion G in FIG. 2, the interval between the second wires 6b and the first wires 6a, and the interval between the second wires 6b and the third wires 6c in the neighborhood above the SDRAM 2 each can be large. Thus, wire interference in the neighborhood above the SDRAM 2 can be prevented.

In the SIP 1, the microcomputer chip 3 has a back surface 3b connected to the frame-shaped first chip mounting section 5d through a die bond material, such as silver paste 4, which is interposed therebetween. Thus, as shown in FIG. 2, the back surface 3b of the microcomputer chip 3 is adhered to some of the encapsulating body 7 at an opening (F portion) defined in the center of the frame-shaped first chip mounting section 5d.

On the other hand, the SDRAM 2 has a back surface 2b similarly connected to the second chip mounting section 5e through a die bond material, such as silver paste 4, which is interposed therebetween. The back surface 2b is connected thereto in a state in which the SDRAM 2 juts out from the slender rectangular or polygonal second chip mounting section 5e. Thus, the back surface 2b of the SDRAM 2 is adhered to some of the encapsulating body 7 at a spot (E portion) that juts out from the second chip mounting section 5e of the SDRAM 2.

Thus, some of the back surfaces 3b and 2b of the microcomputer chip 3 and the SDRAM 2 adhere to some of the encapsulating body 7. Consequently, the areas of the back surfaces which adhere to the encapsulating body 7 can be increased used together with the main surfaces 3a and 2a to secure the chips. As a result, the reflow resistant crack characteristics can be improved.

Incidentally, the respective inner leads 5a, the respective outer leads 5b, the first chip mounting section 5d, the second chip mounting section 5e and the suspension leads 5g in the SIP 1 are respectively formed of, for example, a thin plate material constituted of a copper alloy.

The SDRAM 2 and the microcomputer chip 3 are formed of, for example, silicon. Further, the first wires 6a, the second wires 6b and the third wires 6c are gold wires, for example.

The encapsulating body 7 is formed of, for example, a thermosetting epoxy resin.

A method of manufacturing the SIP 1 according to the present embodiment will be described next.

A lead frame 5, as shown in FIG. 4, is prepared first. That is, the lead frame 5 is prepared having a tub (chip mounting section) 5c comprising a first chip mounting section 5d and a second chip mounting section 5e disposed side-by-side, and a plurality of inner leads 5a and outer leads 5b disposed around the tub 5c.

Incidentally, the lead frame 5 is a plate-shaped frame member formed of a copper alloy or the like. The tub 5c is equivalent to one in which the frame-shaped first chip mounting section 5d and the rectangular slender second chip mounting section 5e are formed integrally. The first chip mounting section 5d and the second chip mounting section 5e respectively have chip support surfaces which are flush with each other.

Figure 5:
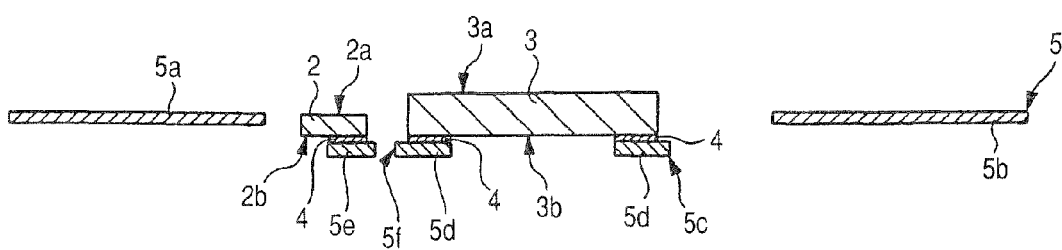
FIG. 5 is a cross-sectional view illustrating one example of the structure at the completion of die bonding during the assembly of the semiconductor device shown in FIG. 1.

Thereafter, die bonding, as shown in FIG. 5, is performed. In the present embodiment, a microcomputer chip 3 is mounted over the first chip mounting section 5d through silver paste 4, which is interposed therebetween, in such a manner that a plurality of pads 3c of the microcomputer chip 3 are disposed over the first chip mounting section 5d. Further, an SDRAM 2 is mounted over the second chip mounting section 5e with the silver paste 4 interposed therebetween in such a manner that a plurality of pads 2c of the SDRAM 2 are disposed over the second chip mounting section 5e.

Incidentally, the microcomputer chip 3 and the SDRAM 2 may be die bonded in either order.

Consequently, the first chip mounting section 5*d* is brought into a state in which it is disposed under the respective pads 3*c* of the microcomputer chip 3, and the second chip mounting section 5*e* is brought into a state in which it is disposed under the respective pads 2*c* of the SDRAM 2.

Figure 6:
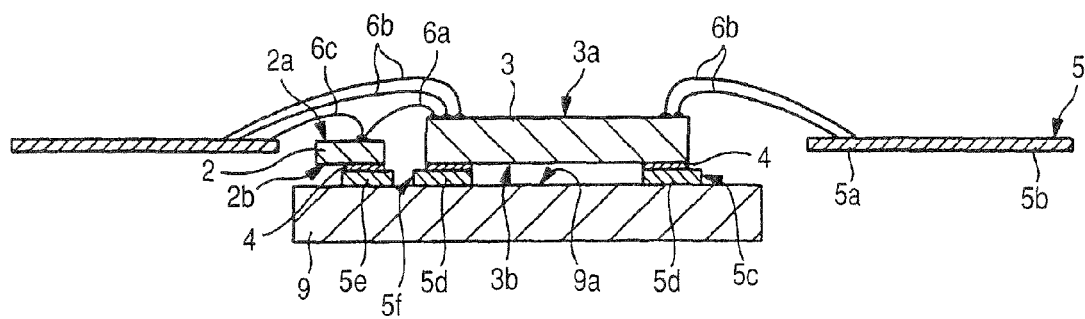
FIG. 6 is a cross-sectional view showing one example of the structure at the completion of wire bonding during the assembly of the semiconductor device shown in FIG. 1.
Figure 8:
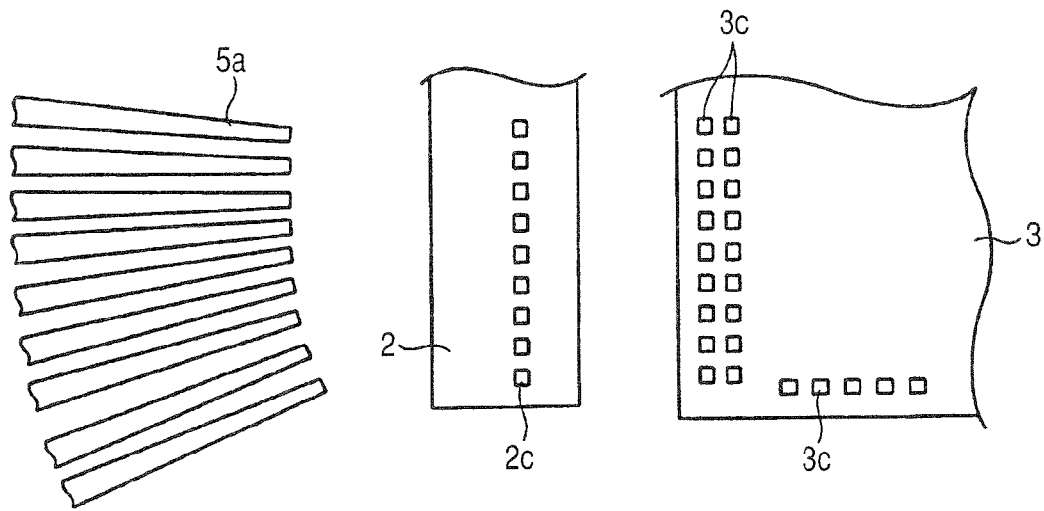
FIG. 8 is an enlarged plan view showing one example of the structure prior to bonding during the wire bonding shown in FIG. 6.
Figure 9:
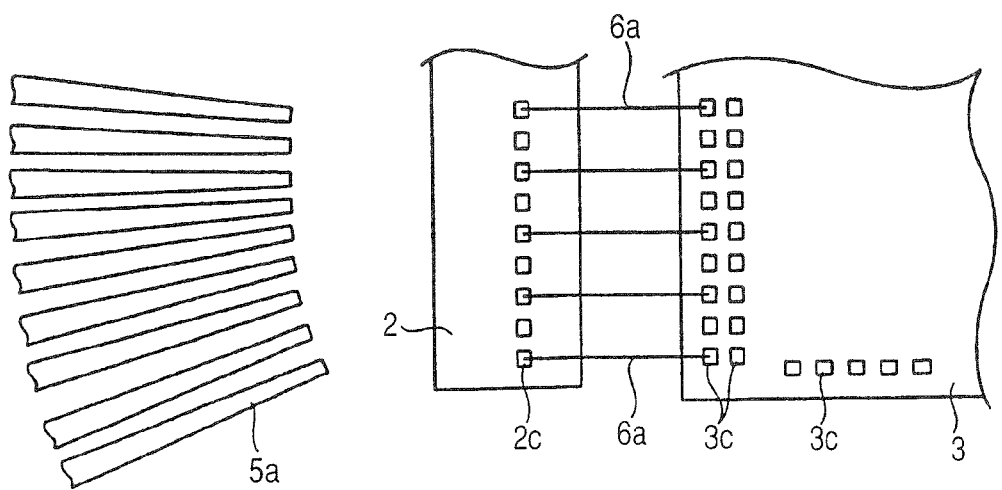
FIG. 9 is an enlarged plan view depicting one example of the structure subsequent to a chip-to-chip connection during the wire bonding shown in FIG. 6.
Figure 10:
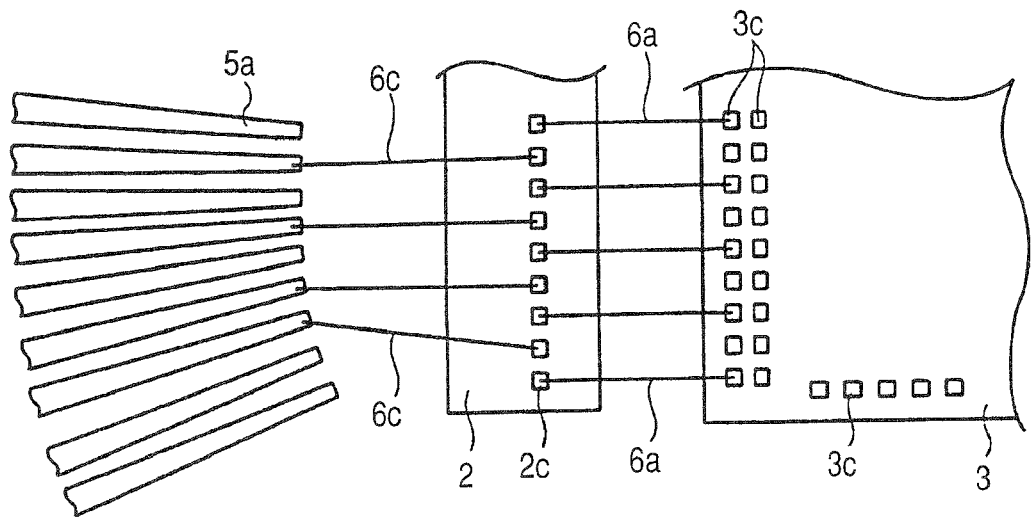
FIG. 10 is an enlarged plan view showing one example of the structure subsequent to a second chip-to-lead connection during the wire bonding shown in FIG. 6.
Figure 11:
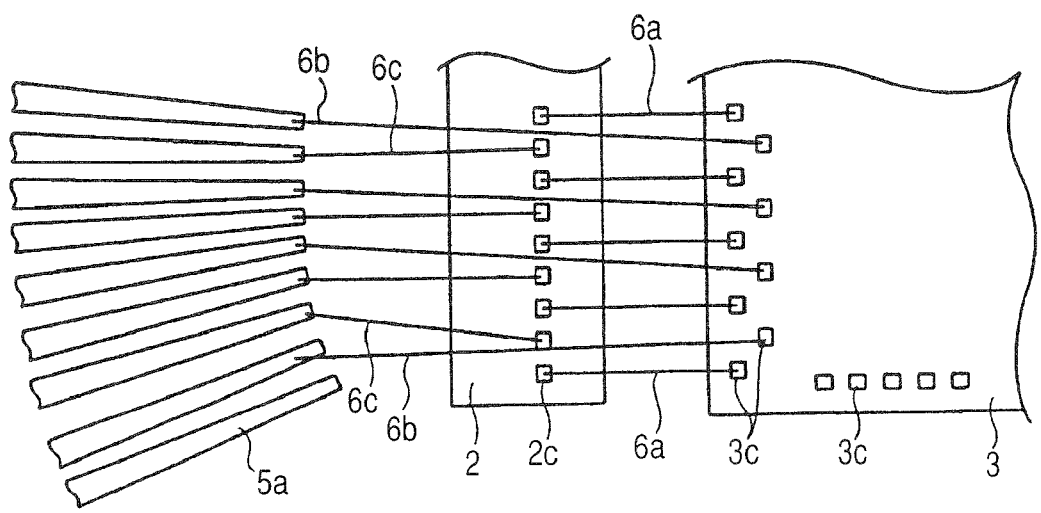
FIG. 11 is an enlarged plan view illustrating one example of the structure subsequent to a first chip-to-lead connection during the wire bonding shown in FIG. 6.

Thereafter, wire bonding is performed using gold lines or the like, as shown in FIG. 6. At this time, as shown in FIGS. 8 through 11, first wires 6*a* are connected between the chips. Subsequently, the SDRAM 2 and the inner leads 5*a* are connected to one another by third wires 6*c*. Thereafter, the microcomputer chip 3 and the inner leads 5*a* are connected by second wires 6*b*. That is, the pads 3*c* of the microcomputer chip 3 and the pads 2*c* of the SDRAM 2 corresponding thereto are respectively wire-bonded by the first wires 6*a*, as shown in FIG. 9, in a state in which the microcomputer chip 3, the SDRAM 2 and the inner leads 5*a* have been disposed as shown in FIG. 8. Subsequently, pads 2*c* of the SDRAM 2 and the inner leads 5*a* corresponding thereto are wire-bonded by the third wires 6*c*, as shown in FIG. 10. Incidentally, the pads 2*c* connected to the inner leads 5*a* via the third wires 6*c* in the SDRAM 2 correspond to electrodes to which a power supply potential or a GND potential is applied. Thereafter, as shown in FIG. 11, pads 3*c* of the microcomputer chip 3 and the inner leads 5*a* corresponding thereto are wire-bonded in such a manner that the second wires 6*b* are caused to bridge or jump over the SDRAM 2.

Figure 12:
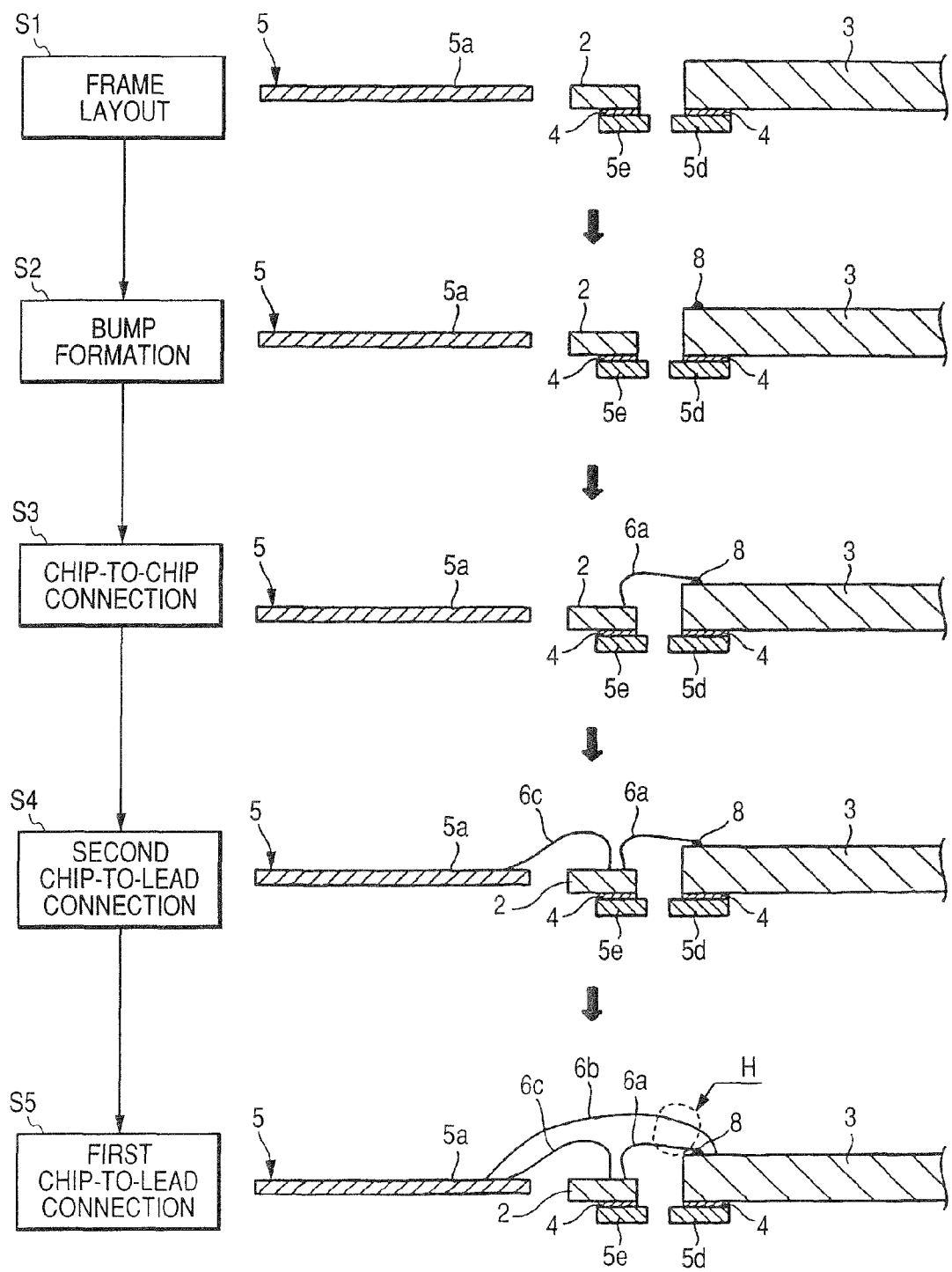
FIG. 12 is a flow diagram of cross-sectional view showing one example of a bonding order during the wire bonding shown in FIG. 6.
Figure 13:
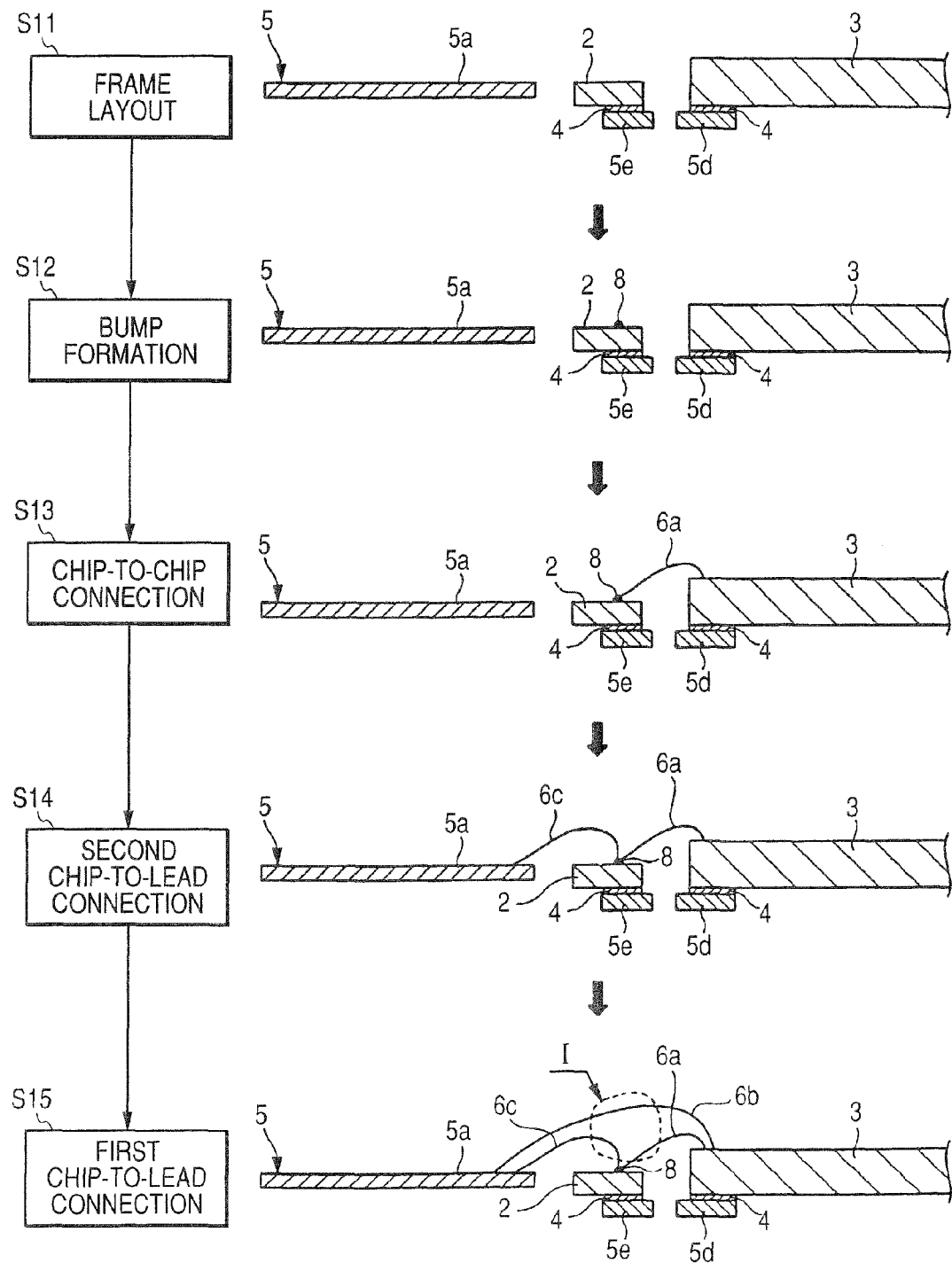
FIG. 13 is a flow diagram of cross-sectional views depicting a bonding order of a modification during the wire bonding shown in FIG. 6.

FIGS. 12 and 13 respectively show the bonding order on the 1st and 2nd sides during bonding of the first wires 6*a* between the chips, wherein FIG. 12 shows a case where, upon wire bonding between the chips, the SDRAM 2 is configured as the 1st side and the microcomputer chip 3 is configured as the 2nd side, and FIG. 13 illustrates a case where the microcomputer chip 3 is configured as the 1st side and the SDRAM 2 is configured as the 2nd side.

That is, according to the bonding method shown in FIG. 12, a frame layout is performed in Step S1. In Step S2, bump formation is carried out. In the present method, gold bumps 8 are formed over the microcomputer chip 3. The gold bumps 8 are formed over the microcomputer chip 3 by, for example, stud bump forming technology using a wire bonding technique.

Thereafter, a chip-to-chip connection indicated in Step S3 is performed. Here, wire bonding is performed with the 1st side of wire bonding as the SDRAM 2 and the 2nd side thereof as the microcomputer chip 3. That is, the first wires 6*a* and the SDRAM 2 are first connected, and, thereafter, the first wires 6*a* and the microcomputer chip 3 are connected. Incidentally, since the gold bumps 8 are formed over the microcomputer chip 3 on the 2nd side, the first wires 6*a* and the microcomputer chip 3 on the 2nd side can also be connected to one another via the gold bumps 8. Forming the gold bumps 8 over the pads 3*c* that are subjected to ire bonding on the 2nd side in advance in this way makes it possible to prevent damage to the microcomputer chip 3 and their connections with enhanced connectivity in the wire bonding process.

Thereafter, a second chip-to-lead connection is made as indicated in Step S4. That is, the SDRAM 2 and the inner leads 5*a* are connected by the third wires 6*c*. Subsequently, a first chip-to-led connection indicated in Step S5 is performed. That is, the microcomputer chip 3 and the inner leads 5*a* are connected by the second wires 6*b*.

Thus, upon completion of the chip-to-chip connection, the SDRAM 2 (thin semiconductor chip) is configured as the 1st side and the microcomputer chip 3 (thick semiconductor chip) is configured as the 2nd side. Consequently, the interval between each of the first wires 6*a* and its corresponding second wire 6*b* in the neighborhood above the microcomputer chip 3 can large, as indicated by the portion H in Step S5 of FIG. 12, and, hence, wire interference in the neighborhood above the microcomputer chip 3 can be prevented.

Next, a frame layout is performed in Step S11 and bump formation is carried out in Step S12 in a bonding method according to a modification shown in FIG. 13. Here, gold bumps 8 are formed over an SDRAM 2.

Thereafter, a chip-to-chip connection indicated in Step S13 is performed. Here, wire bonding is performed with the 1st side of wire bonding as the microcomputer chip 3 and the 2nd side thereof as the SDRAM 2. That is, first wires 6*a* and the microcomputer chip 3 are first connected, and, thereafter, the first wires 6*a* and the SDRAM 2 are connected. Incidentally, since the gold bumps 8 are formed over the SDRAM 2 on the 2nd side, the first wires 6*a* and the SDRAM 2 on the 2nd side can also be connected to one another via the gold bumps 8. Thus, they can be connected with an enhanced connectivity.

Thereafter, a second chip-to-lead connection is made, as indicated in Step S14. That is, the SDRAM 2 and inner leads 5*a* are connected by third wires 6*c*. Subsequently, a first chip-to-lead connection, as indicated in Step S15, is performed. That is, the microcomputer chip 3 and the inner leads 5*a* are connected by second wires 6*b*.

Thus, upon completion of the chip-to-chip connection, the microcomputer chip 3 (thick semiconductor chip) is configured as the 1st side and the SDRAM 2 (thin semiconductor chip) is configured as the 2nd side. Consequently, the interval between each of the first wires 6*a* and its corresponding second wire 6*b* in the neighborhood above the SDRAM 2 can be large, as indicated by the portion I in Step S15 of FIG. 13, and, hence, wire interference in the neighborhood above the microcomputer chip 3 can be further prevented.

Incidentally, the gold bumps 8 may be formed at electrodes of a predetermined semiconductor chip before the wire bonding process is carried out, e.g., in a wafer state, such as in a wafer or pre-process in advance as timing provided to form the gold bumps 8 over the semiconductor chip on the 2nd side, upon completion of the chip-to-chip connection by the first wires 6*a*.

In the wire bonding employed in the first embodiment, as shown in FIG. 6, the first chip mounting section 5*d* and the second chip mounting section 5*e* are respectively disposed below the pads 3*c* and 2*c* in both the microcomputer chip 3 and the SDRAM 2. Therefore, the wire bonding can be performed in a state in which the first chip mounting section 5*d* and the second chip mounting section 5*e* are supported by the same flat surface 9*a* of a heat stage 9 corresponding to a heating jig. That is, the surface of the heat stage 9, which supports the microcomputer chip 3 and the SDRAM 2, can be configured as a flat surface 9*a*, defined as the same plane. The pads 3*c* of the microcomputer chip 3 and the pads 2*c* of the SDRAM 2 are bonded by their corresponding first wires 6*a* in a state in which lower portions of the pads 3*c* and 2*c* are respectively supported by the same flat surface 9*a* of the heat stage 9. Then, the pads 2*c* of the SDRAM 2 and inner leads 5*a* are bonded by their corresponding third wires 6*c*. Further, the pads 3*c* of the microcomputer chip 3 and the inner leads 5*a* are respectively connected by their corresponding second wires 6*b*.

Forming the surface that supports the semiconductor chips, lying over the heat stage 9, as a flat surface 9*a* providing a common support surface in this way makes it possible to form the heat stage 9 at a low cost with the shape of the heat stage 9 existing as an easy shape which is able to reliably support the bonding loads under the respective pads 3*c* and 2*c*. Heating the pads 3c and 2c by use of the heat stage 9 can be reliably performed. It is therefore possible to enhance the bonding property.

Figure 7:
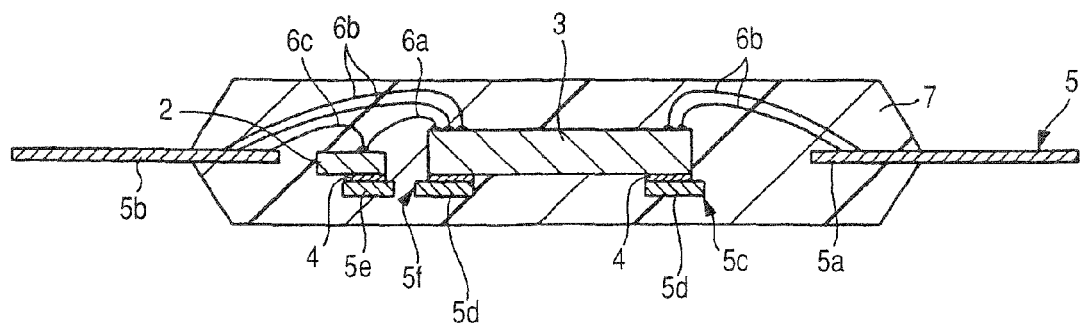
FIG. 7 is a cross-sectional view illustrating one example of the structure at the completion of resin sealing during the assembly of the semiconductor device shown in FIG. 1.

After the wire bonding, the resin sealing or molding shown in FIG. 7 is performed. Here, the microcomputer chip 3, SDRAM 2 and tub 5c, and the plurality of first wires 6a, second wires 6b, third wires 6c and inner leads 5a are resin sealed or molded by resin molding to form a sealing or encapsulating body 7.

Thereafter, the plurality of outer leads 5b are cut and separated from the lead frame 5 to bring them into fractionization. Further, the outer leads 5b are bent and formed in a gull-wing form, thereby leading to completion of the assembly of the SIP 1.

Figure 14:
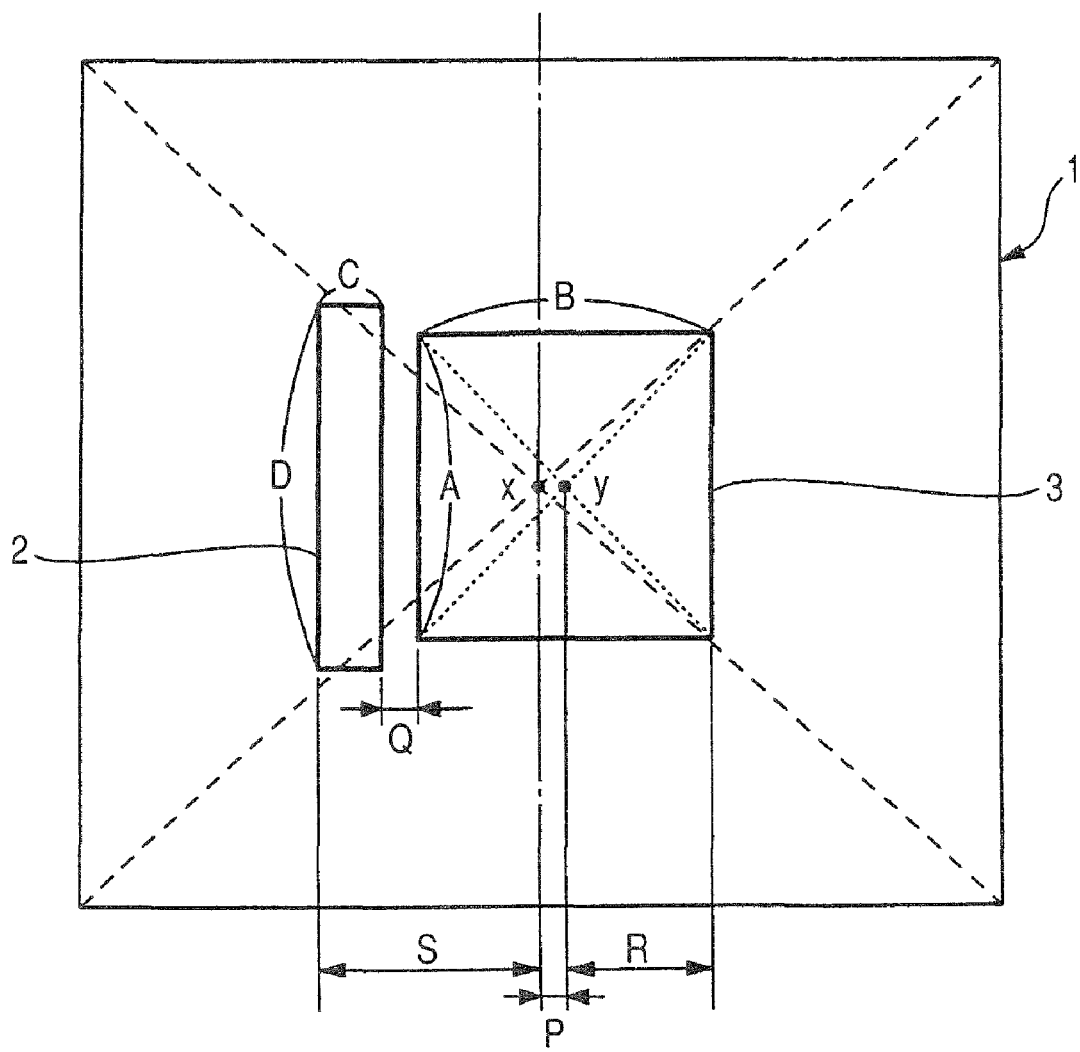
FIG. 14 is a plan view showing one example of a chip arrangement layout in the semiconductor device shown in FIG. 1.

Next, FIG. 14 shows conditions for an arrangement of two semiconductor chips when the microcomputer chip 3 and the SDRAM 2 are disposed laterally side by side in an SIP 1. Assuming now that the length of the long side of the microcomputer chip 3 is defined as A and the length of its short side is defined as B, and the center in a plane direction is defined as y, whereas the length of the long side of the SDRAM 2 is defined as D and the length of its short side is defined as C, and the center in a plane direction of the SIP 1 is defined as x, and further an absolute value of (x−y) is defined as P (P: distance between x and y as viewed in the direction parallel to the direction of the short side of the SDRAM 2), and the interval between the microcomputer chip 3 and the SDRAM 2 is defined as Q, P<(C/2) may preferably be established.

Assuming that the microcomputer chip 3 and the SDRAM 2 are considered to be one rigid body formed of silicon, and the center of the rigid body is placed in alignment with the center x of the SIP 1, ½ of (C+Q+B) results in a length S. That is, $S=(C+Q+B)\times(1/2)$. The amount of a displacement (x−y) between the center y of the microcomputer chip 3 and the center x of the SIP 1 is expressed in (x−Y)=P, where P=S−R. In determining P, since R=B/2 yields P=((C+Q+B)/2−B/2), accordingly, $$P=(C+Q)/2.$$

Thus, when the amount of the displacement P between the center y of the microcomputer chip 3 and the center x of the SIP 1 becomes smaller than (C+Q)/2 and, further, becomes smaller than (C/2), the center y of the microcomputer chip 3 is brought to a state where it is very close to the center x of the SIP 1. Therefore, P is set to P<(C/2) to allow the center y of the microcomputer chip 3 to further approach the center x of the SIP 1. As a result, the plurality of second wires 6b bonded around the four sides of the microcomputer chip 3 can be made substantially equal to one another in length. Thus, the balance of the flow or the like of a resin upon resin molding can be improved.

That is, since the plurality of second wires 6b are respectively disposed in four directions corresponding to the four sides of the encapsulating body 7 of the SIP 1, the lengths of these second wires 6b can be made substantially equal to one another. As a result, the balance of the flow of the resin upon resin molding can be improved.

Further, as shown in FIG. 14, the long side of the microcomputer chip 3 and the long side of the SDRAM 2 are laid out in an opposing relationship. Thus, when the microcomputer chip 3 and the SDRAM 2 are considered to be one rigid body formed of silicon, the rigid body is disposed so as to be well-balanced with respect to the SIP 1. Therefore, the balance of internal stress is improved and the warpage of the SIP 1 or the like can be reduced.

Incidentally, although the SDRAM 2 in the SIP 1 has a rectangular plane shape, the microcomputer chip 3 is not always rectangular. For example, it may be a square.

A lead frame 5 according to a modification shown in each of FIGS. 15 and 16 will be explained next.

Figure 15:
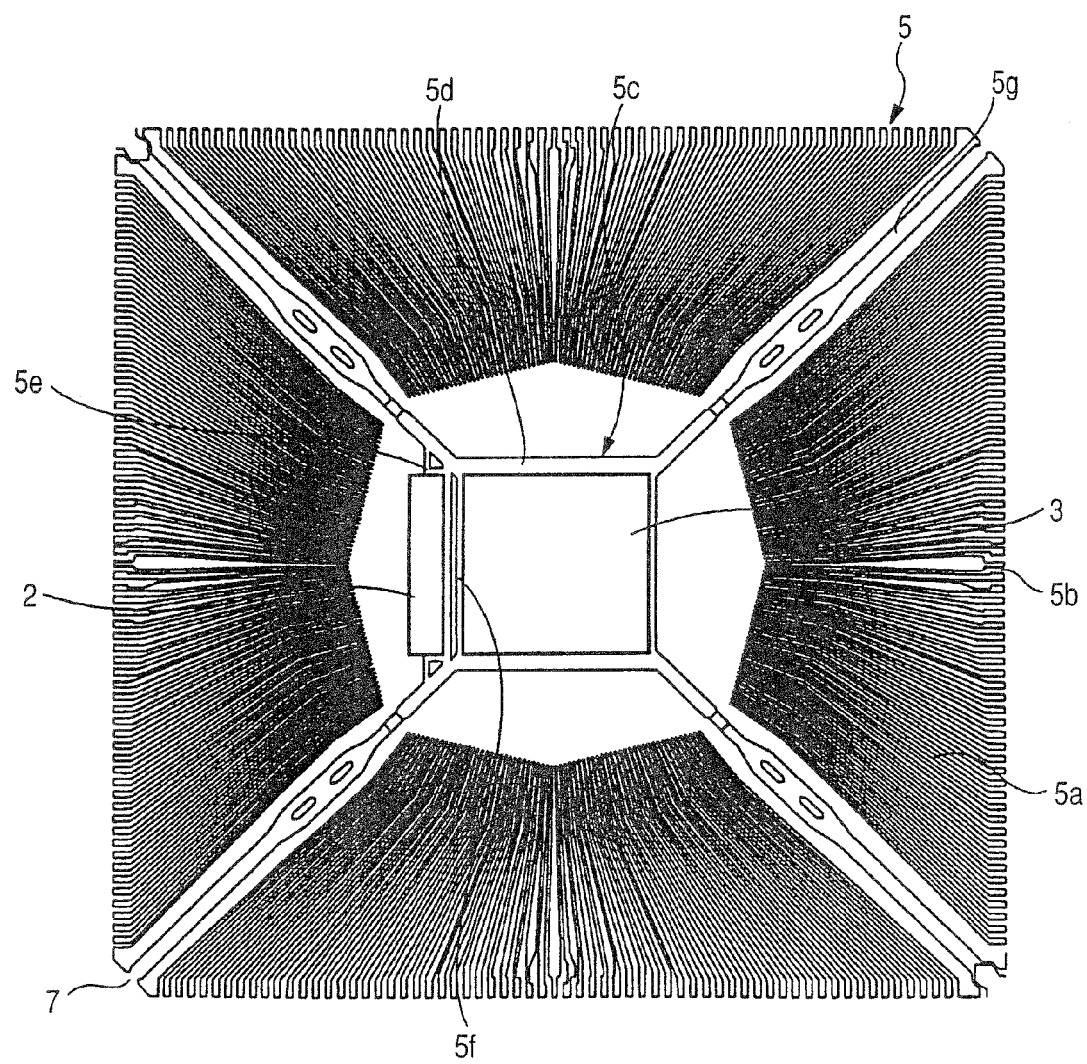
FIG. 15 is a plan view illustrating the structure of a modification of the lead frame employed in the assembly of the semiconductor device according to the first embodiment of the present invention.

In the lead frame 5 shown in FIG. 15, a slit 5f is formed in an area between the first chip mounting section 5d and the second chip mounting section 5e at a tub 5c of the lead frame 5. The slit 5f is formed to be slender in the area between the first chip mounting section 5d and the second chip mounting section 5e along the long side of the slender rectangular second chip mounting section 5e.

Thus, when the assembly of the SIP 1 is completed, a structure is obtained in which the sealing resin enters into the slit 5f and is cured, as shown in FIG. 2, and some of the encapsulating body 7 is embedded into the slit 5f.

Since the sealing resin (e.g., epoxy thermosetting resin) has a poor thermal conductivity, some (resin within the slit 5f) of the encapsulating body 7 is disposed between the chips. Consequently, the transfer of heat generated from the microcomputer chip 3 is cut off by some of the encapsulating body 7 disposed between the chips, thereby making it possible to avoid the transfer of the heat to the SDRAM 2.

That is, since the microcomputer chip 3, having a CPU 3d that performs a lot of signal processing, has a much larger power consumption than the SDRAM 2 having a memory circuit and therefore also generates a greater amount of heat, the heat generated from the microcomputer chip 3 is cut off by the resin in the slit 5f so that the heat is not transferred to the SDRAM 2, thereby making it to possible to prevent degradation of the characteristics of the SIP 1.

Figure 16:
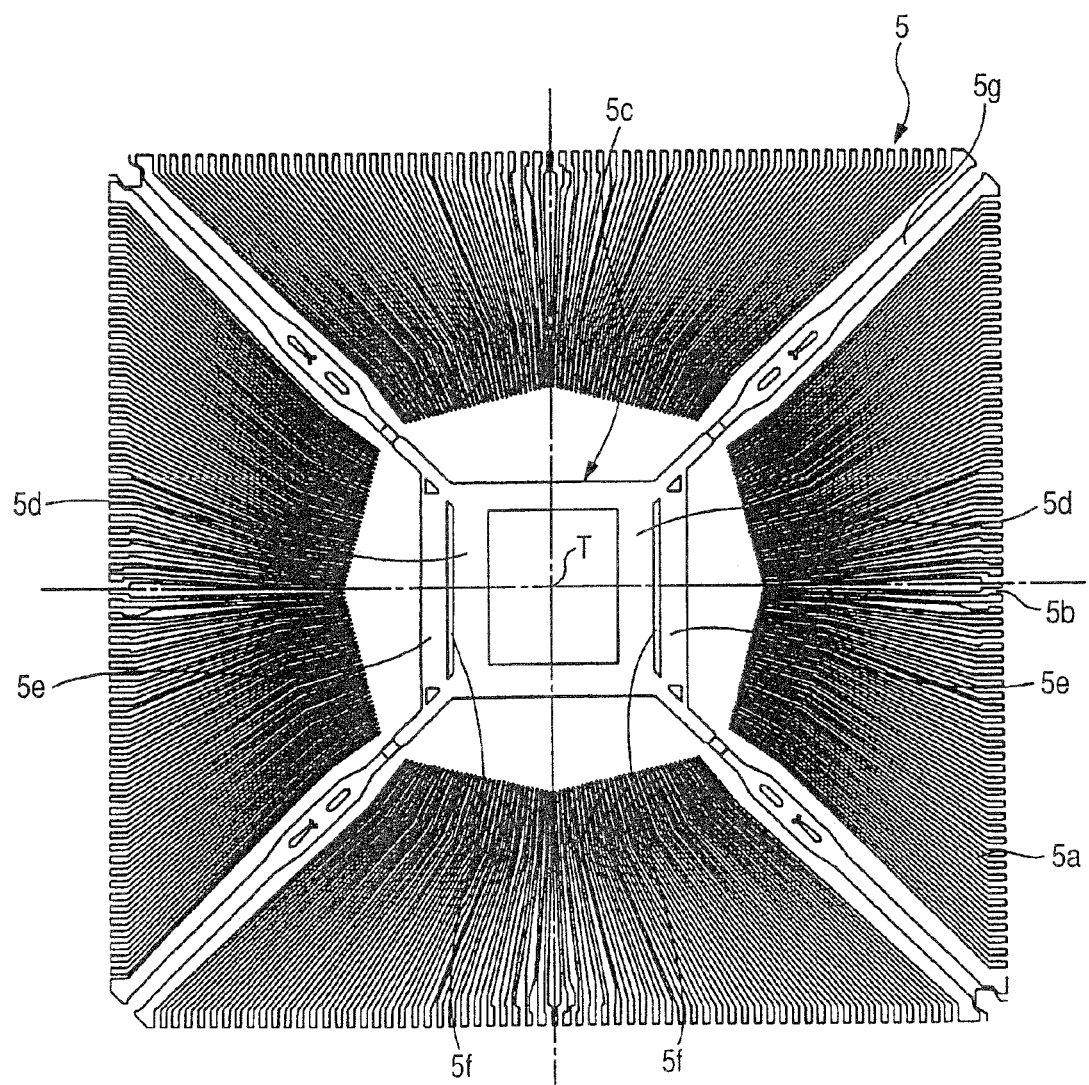
FIG. 16 is a plan view depicting the structure of the modification of the lead frame employed in the assembly of the semiconductor device according to the first embodiment of the present invention.

In the lead frame 5 shown in FIG. 16, the pattern shape of the tub 5c comprising the first chip mounting section 5d and the second chip mounting section 5e formed integrally is formed point-symmetrically (rotational-symmetrically through) 180° with the center (center T of a device region corresponding to one SIP 1 at the lead frame 5), in a plane direction, of the main body (encapsulating body 7) of the SIP 1.

Thus, when frame processing by stamping is performed, the pattern shape point-symmetric with respect to the center enables an improvement in processing accuracy, and the processability of the lead frame 5 can be enhanced to make it easy to fabricate it. Further, stress generated in the lead frame 5 upon assembly of the SIP 1 can be applied over the entirety of the main body of the SIP 1 substantially evenly and with satisfactory balance.

Further, the flow of the sealing resin at the time of resin molding can be well-balanced upon resin sealing, and warpage of the encapsulating body 7, which occurs upon thermosetting or heat-curing of the sealing resin, can be reduced.

An SIP 10 according to a modification shown in FIG. 17 will be described next.

Figure 17:
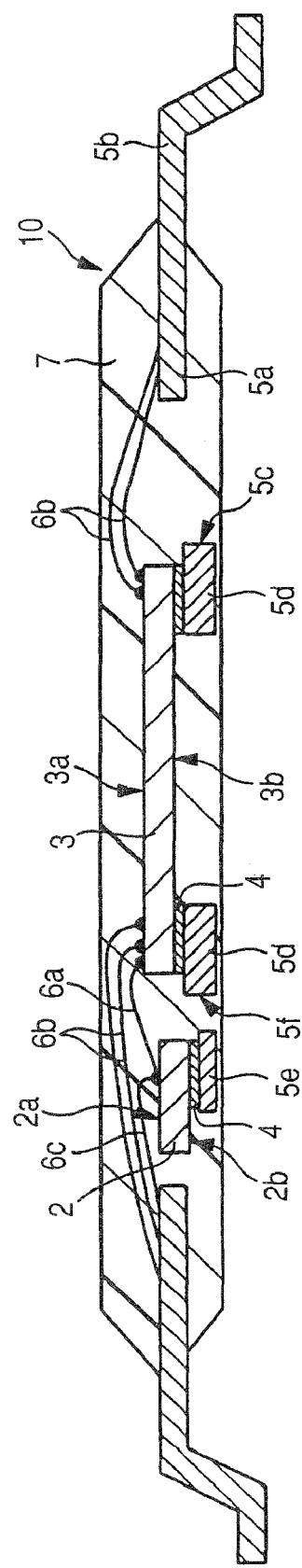
FIG. 17 is a cross-sectional view showing the structure of a semiconductor device illustrative of a modification according to the first embodiment of the present invention.

The SIP 10 shown in FIG. 17 is similar in structure to the SIP 1 shown in FIG. 2. However, the SIP 10 is different from the SIP 1 in that the thickness of the microcomputer chip 3, which is thicker than the SDRAM 2 in the SIP 1, is identical to the thickness of the SDRAM 2 in this embodiment, and the thickness of the second chip mounting section 5e at the tub 5c is thinner than the first chip mounting section 5d.

That is, while the SIP 10 is similar to the SIP 1 in structure, the thickness of the microcomputer chip 3 is thinner than the one in the SIP 1 so as to be substantially equal to the SDRAM 2 in thickness in order to achieve a thinning of the SIP 10. At this time, first wires 6a that connect between the chips, third wires 6c that connect between the SDRAM 2 and the leads, and second wires 6b which bridge or jump over the SDRAM 2 and form loops higher than the first wires 6a and the third wires 6c are disposed over the SDRAM 2 in a manner similar to that in the SIP 1. Therefore, there is a need to establish a difference between the vertical positions of the pads 3c and 2c between both chips in a manner similar to the SIP 1. Thus, the thickness of the second chip mounting section 5e is thinner than that of the first chip mounting section 5d, to thereby establish a difference between the vertical positions of the pads 3c and 2c between both chips.

The thickness of the second chip mounting section 5e is formed to be about one-half the thickness of the first chip mounting section 5d by half-etching or stamping processing, for example. Thus, since the microcomputer chip 3 and the SDRAM 2 are identical in thickness, the vertical positions of the pads 3c and 2c between both chips are similar to the SIP 1, i.e., the pads 2c of the SDRAM 2 are located at vertical positions lower than the pads 3c of the microcomputer chip 3. That is, a difference in the vertical position between both pads can be established.

Thus, in a manner similar to the SIP 1, the second wires 6b that connect the microcomputer chip 3 and inner leads 5a bridge or jump over the SDRAM 2, and the loop of the second wires 6b can be formed at a position higher than the loop of the first wires 6a. As a result, the interval between each of the second wires 6b and its corresponding first wire 6a in the neighborhood above the SDRAM 2, and the interval between each of the second wires 6b and its corresponding third wire 6c in the neighborhood thereabove are set to be large to the possibility of wire interference. Further, since the thickness of the microcomputer chip 3 can be made thin to the same degree as the SDRAM 2, as compared with the SIP 1, the thinning of the SIP 10 can be achieved.

Figure 18:
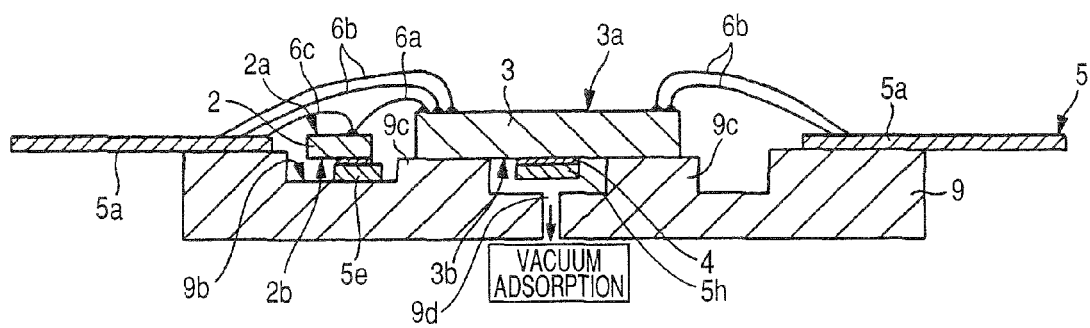
FIG. 18 is a cross-sectional view depicting the structure during wire bonding at the assembly of the semiconductor device illustrative of the modification according to the first embodiment of the present invention.

A modification shown in FIG. 18 will be described next. FIG. 18 shows an example in which a lead frame 5 is supported by a heat stage 9 upon wire bonding during the assembly of an SIP product having a structure such that the back surface 3b of a microcomputer chip 3 is supported by a small tub 5h that is smaller in area than the back surface 3b.

That is, the form of support of the lead frame 5 by the heat stage (heating jig) 9 during wire bonding in the case of an SIP product having a small tub structure is shown. Air is vacuum-evacuated from an exhaust port 9d of the heat stage 9 to vacuum-adsorb the back surface 3b, on which the small tub 5h is supported, of the microcomputer chip 3, thereby electrically connecting a plurality of pads 3c of the microcomputer chip 3 and a plurality of pads 2c of the SDRAM 2 by a plurality of conductive first wires 6a, respectively, in a state in which the lower portions of the plural pads 3c of the microcomputer chip 3 are supported by a convex portion 9c of the heat stage 9, and a second chip mounting section 5e of the lead frame 5 is supported within a concave portion 9b of the heat stage 9. Further, in this state, the pads 2c of the SDRAM 2 and the inner leads 5a corresponding thereto are electrically connected by third wires 6c, and the plural pads 3c of the microcomputer chip 3 and the plural inner leads 5a are respectively electrically connected by a plurality of conductive second wires 6b.

In the case of the SIP product having a small tub structure, the lower portions of the pads 3c of the microcomputer chip 3 need not necessarily be supported by the first chip mounting section 5d. Upon wire bonding, spots corresponding to the pads 3c, which are provided over the back surface 3b, are directly supported by some (convex portion 9c) of the heat stage 9, so that wire bonding can be effected even on an SIP product having a small tub structure in a manner similar to the SIP 1 and the SIP 10.

Second Preferred Embodiment

Figure 19:
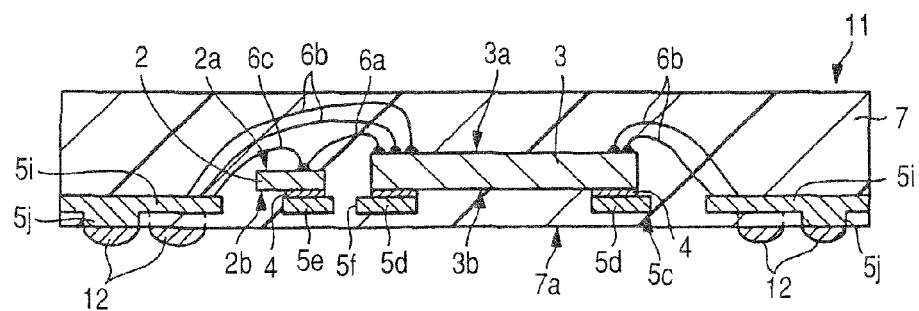
FIG. 19 is a cross-sectional view illustrating one example of the structure of a semiconductor device according to a second embodiment of the present invention.
Figure 20:
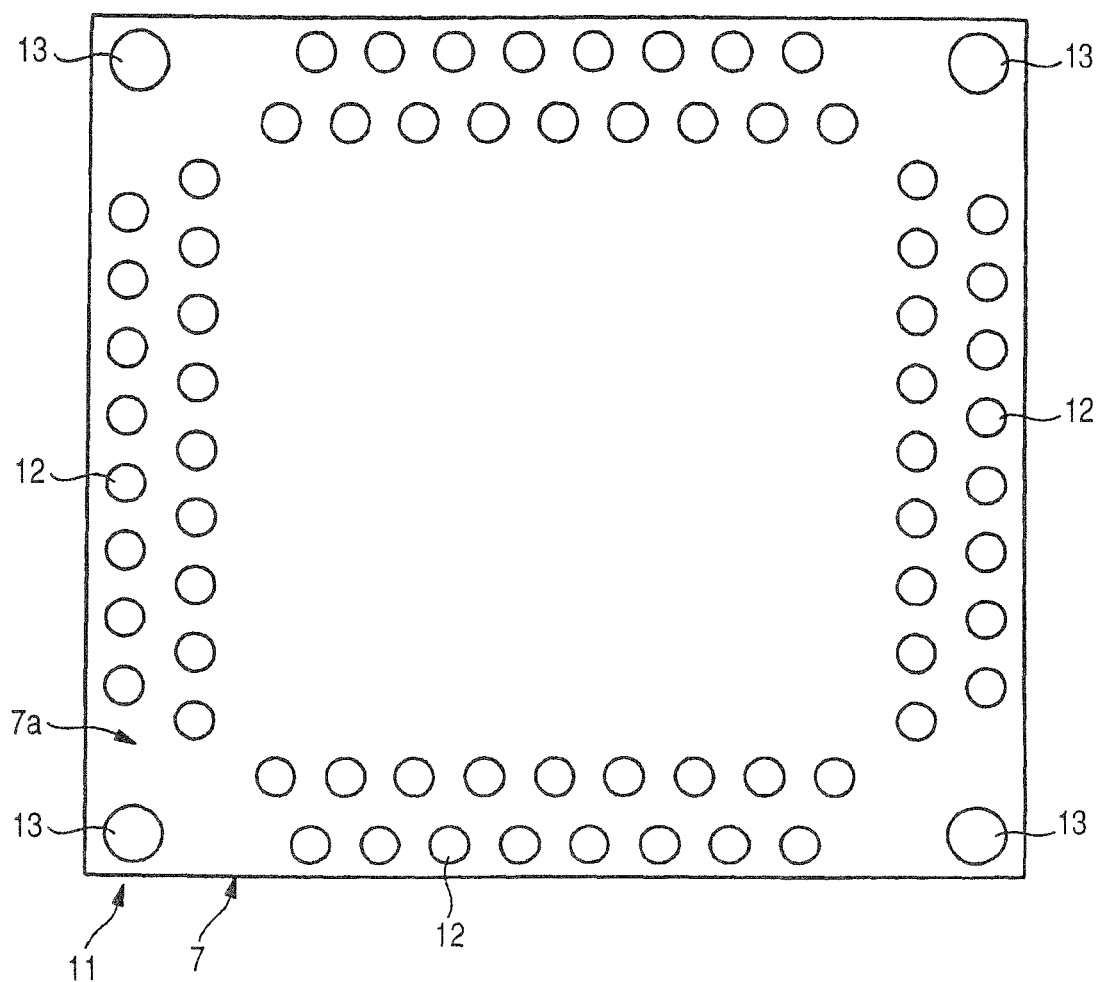
FIG. 20 is a back view showing one example of the structure of the semiconductor device shown in FIG. 19.
Figure 21:
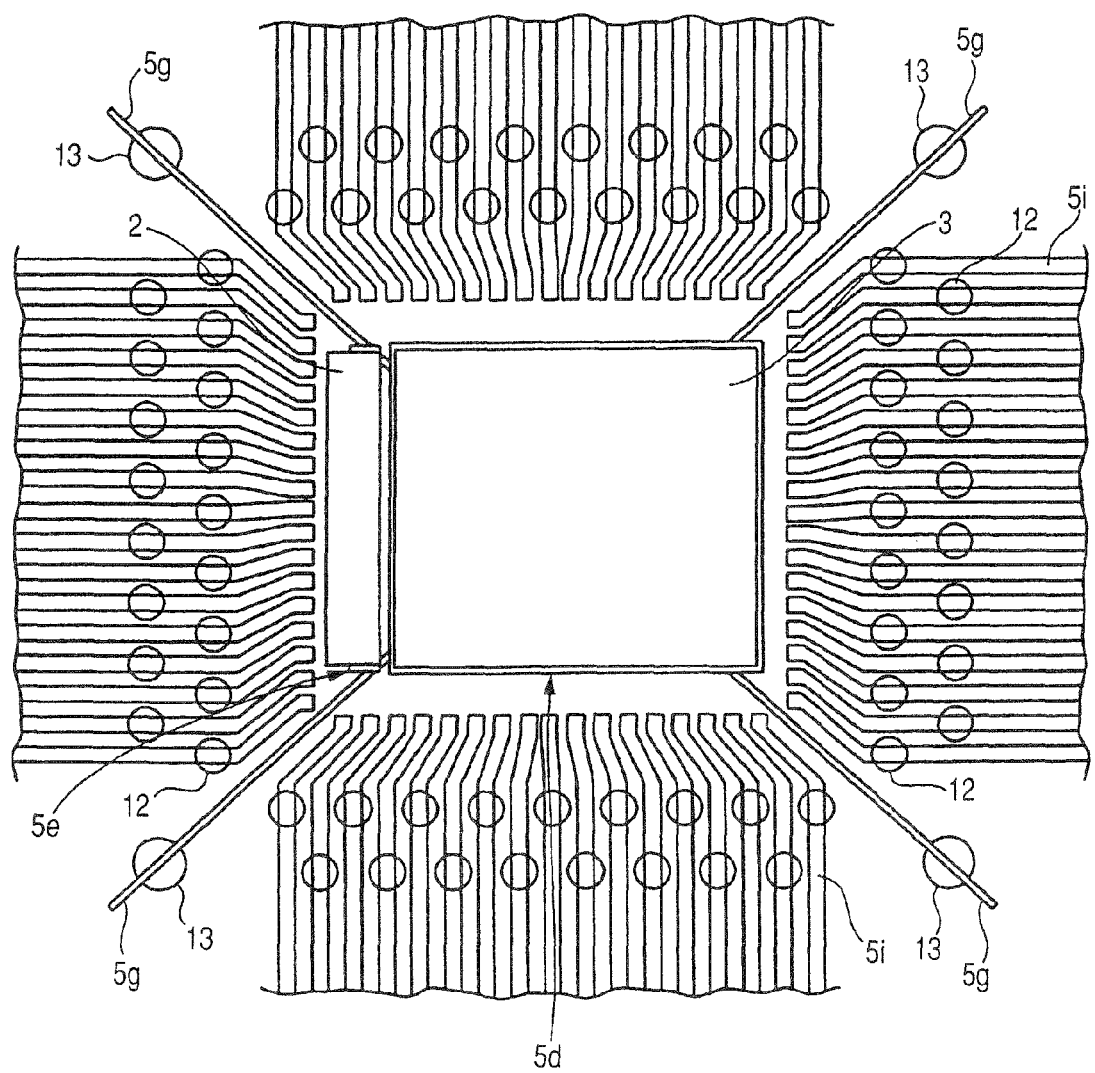
FIG. 21 is a plan view depicting one example of a relationship between a lead array and an external terminal array employed in the semiconductor device shown in FIG. 19.

FIG. 19 is a cross-sectional view showing one example of the structure of a semiconductor device according to a second embodiment of the present invention. FIG. 20 is a back view showing one example of the structure of the semiconductor device shown in FIG. 19, and FIG. 21 is a plan view depicting one example of a relationship between a lead array and an external terminal array employed in the semiconductor device shown in FIG. 19.

In a manner similar to the SIP 1 according to the first embodiment, the semiconductor device according to the second embodiment, as shown in FIG. 19, is in the form of an SIP 11 in which a microcomputer chip 3 and an SDRAM 2 are disposed laterally side by side. A point of difference between the SIP 11 and the SIP 1 according to the first embodiment resides in the fact that the shape of the semiconductor device is set to a QFN (Quad Flat Non-leaded Package) type rather than being set to the QFP type.

That is, the SIP 11 according to the second embodiment is of a QFN type semiconductor chip and is equivalent to that in which a plurality of bump electrodes 12 corresponding to external terminals are disposed side by side at a peripheral edge portion of a back surface 7a of an encapsulating body 7, as shown in FIG. 20. Incidentally, since the SIP 11 according to the second embodiment is one in which the number of pins is increased in a manner similar to the first embodiment, the plurality of bump electrodes 12 are disposed side by side in two rows in an offset manner at the peripheral edge portion of the back surface 7a of the encapsulating body 7.

As shown in FIG. 19, the respective bump electrodes 12 are bonded to protrusions 5j to the back surface sides of lead portions (leads) 5i. Further, as shown in FIG. 21, the bump electrodes 12 are bonded to the leads 5i side by side in two rows in an offset manner such that the bump electrodes 12 are not short-circuited between the adjacent leads 5i.

Reinforcing terminals 13 are respectively bonded to suspension leads 5g disposed at the four corners.

Since the QFN type SIP 11 according to the second embodiment is similar in other structural feature to the QFP type SIP 1 according to the first embodiment, repeated explanations thereof are omitted.

Since advantageous effects obtained by the QFN type SIP 11 according to the second embodiment are similar to those of the QFP type SIP 1 according to the first embodiment, repeated explanations thereof are omitted.

Third Preferred Embodiment

Figure 22:
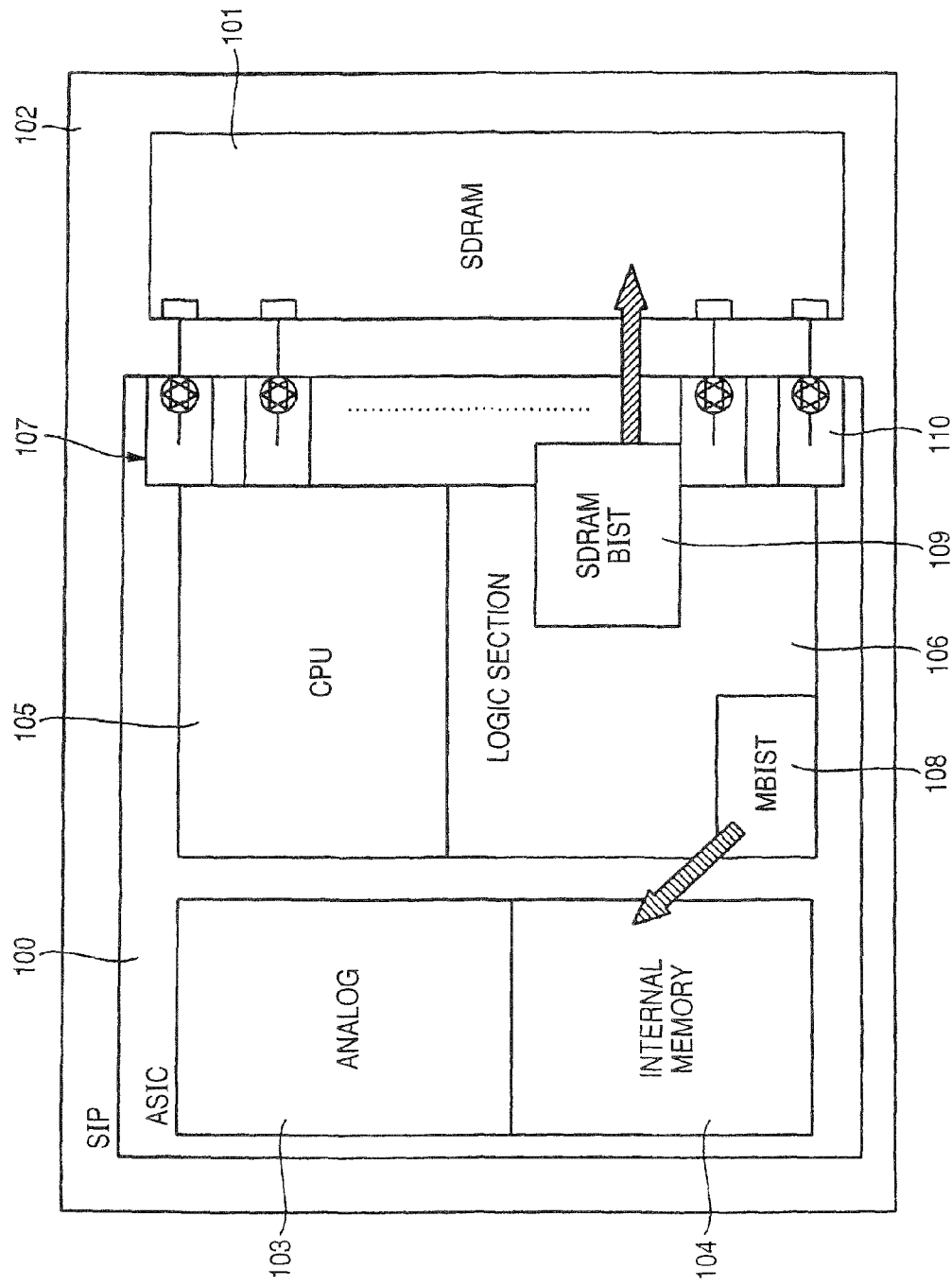
FIG. 22 is a diagram showing the structure of a semiconductor device according to a third embodiment of the present invention.
Figure 23:
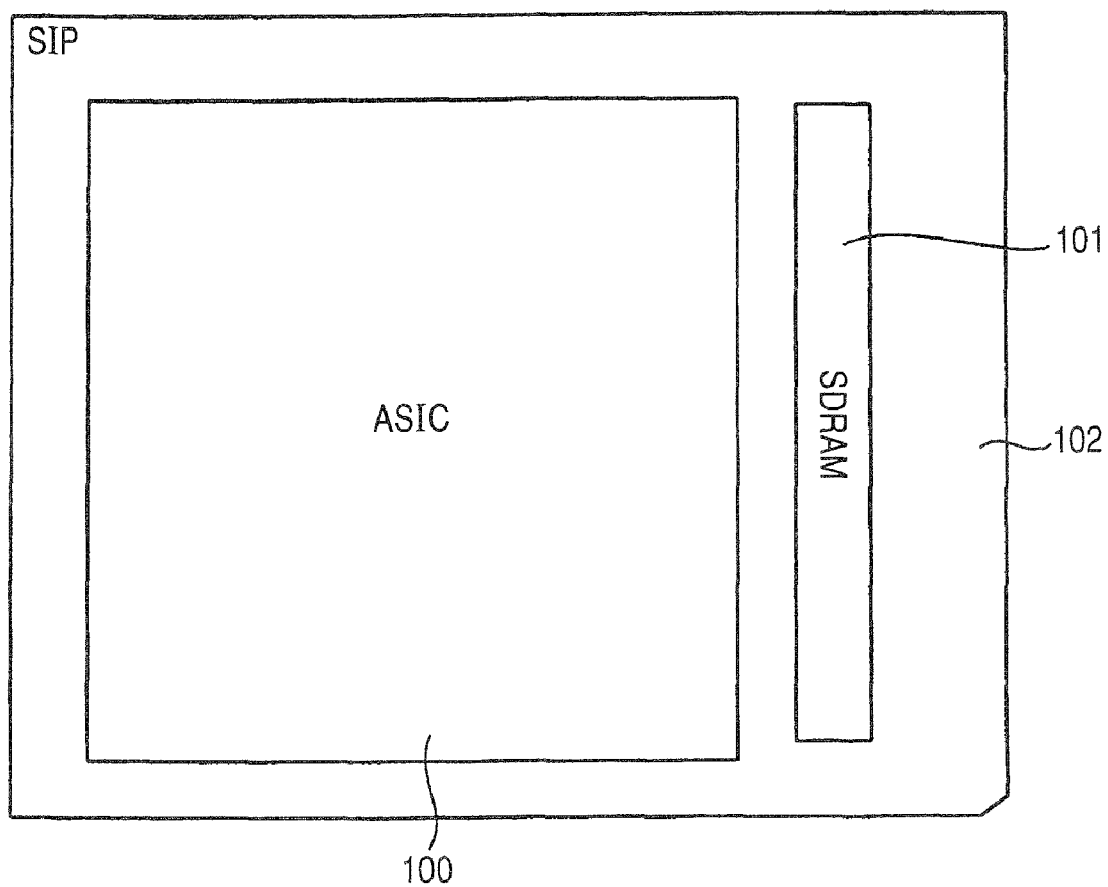
FIG. 23 is a diagram illustrating an arrangement of respective chips employed in the semiconductor device according to the third embodiment of the present invention.

FIG. 22 is a conceptual diagram showing the overall configuration of a semiconductor device according to a third embodiment of the present invention, and FIG. 23 is a conceptual diagram illustrating a layout of an ASIC and an SDRAM in a package in the semiconductor device according to the third embodiment.

One example of a configuration of the semiconductor device according to the third embodiment will first be explained with reference to FIG. 22. The semiconductor device according to the third embodiment is configured as an SIP 102 in which, for example, an ASIC (system chip) 100 and an SDRAM (memory chip) 101 are mounted in a single package (e.g., QFP or the like). It comprises the ASIC (Application Specific Integrated Circuit) 100 including an analog section 103, an internal memory 104, a CPU (Central Processing Unit) 105, a logic section 106, an IO (Input/Output) section 107, an MBIST (Memory Built In Self Test) 108, an SDRAM MBIST (Synchronous Dynamic Random Access Memory Built In Self Test) 109, etc., the SDRAM (Synchronous Dynamic Random Access Memory) 101, etc. The IO section 107 in the ASIC 100 comprises a plurality input/output buffers 110 for receiving control signals, other buffers, etc.

Signal lines (corresponding to e.g., a data signal, an address signal, a control signal, a clock signal, etc. in the SDRAM 101) which are connected only between the ASIC 100 and the SDRAM 101 and which need not be connected to external terminals of the SIP 102 are connected to the input/output buffers 110 in the ASIC 100. Each of the input/output buffers 110 is a buffer that is capable of determining an IO leak at each terminal.

The MBIST 108 is a circuit which generates a test pattern thereinside and tests the internal memory 104. The SDRAM-BIST 109 is a circuit which generates a test pattern thereinside and tests the SDRAM 101. The SDRAMBIST 109 executes, as test items of the SDRAM 101, for example, X-MARCH, Y-MARCH, a Pause test, a Disturb test, etc. Control signals of IO leak determination circuits for the input/output buffers 110 may be provided within the SDRAMBIST 109 or they may be contained in a test mode circuit (boundary scan circuit or the like).

Incidentally, the ASIC 100 which is used as a system chip may be a semiconductor chip having other computation processing functions, such as a CPU, a general-purpose processor, a DSP or the like. The SDRAM 101 which is used as a memory chip may be a semiconductor chip having other memory functions, such as a normal DRAM, SDRAM, nonvolatile memory (Flash memory or the like) or the like.

FIG. 23 shows the layout of each chip of the SIP 102 equipped with the ASIC 100 and the SDRAM 101 within the single package, such as a QFP (Quad Flat Package) or the like.

Figure 24:
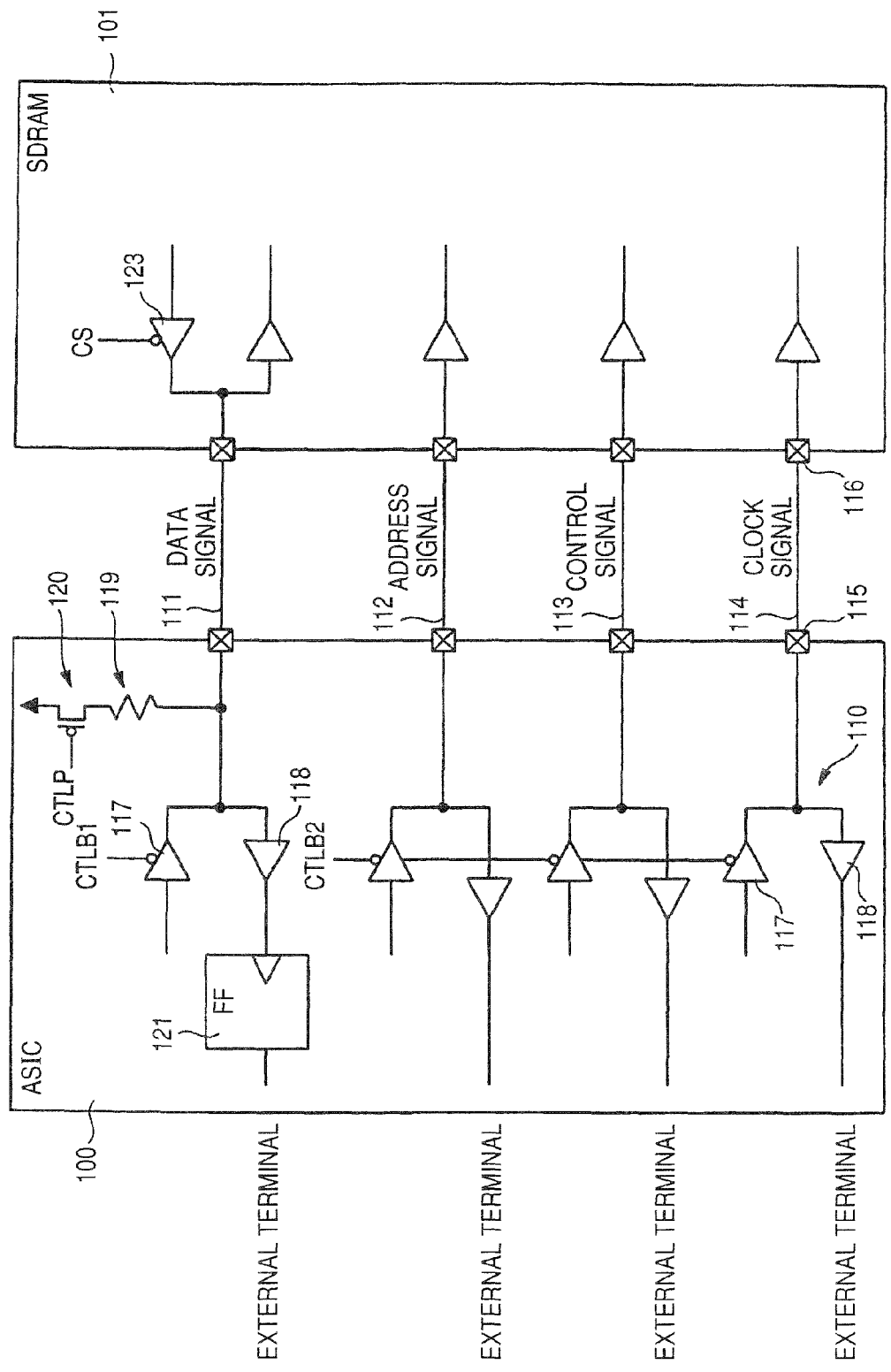
FIG. 24 is a schematic diagram depicting the details of a buffer section which receives control signals at a signal line connecting section between an ASIC and an SDRAM in the third embodiment of the present invention.

FIG. 24 is a view showing the details of a buffer section which receives control signals at a signal line connecting section between the ASCI 100 and the SDRAM 101. As shown in FIG. 24, a data signal 111, an address signal 112, a control signal 113, and a clock signal 114 are connected only between the chips and correspond to signal lines that do not extend to external terminals of the SIP 102. The respective signal lines are connected between terminals (each corresponding to a first terminal) on the ASIC 100 side and terminals (each corresponding to a second terminal) on the SDRAM 101 side by wire bonding or the like.

The input/output buffers 110 which receive the control signals comprise tri-state type output buffers 117 and input buffers 118, etc. The output buffers 117 are inputted with control signals CTLB1 and CTLB2. When the control signals CTLB1 and CTLB2 are respectively brought to an on state, the terminals 115 and 116 are charged or discharged to a level of "0" or "1". When the control signals CTLB1 and CTLB2 are respectively brought to off, the terminals 115 and 116 are respectively brought to a high impedance state.

When the input/output buffer is provided with a pull-up circuit 119 or a pull-down circuit (not shown) as in the data 111, a switch 120 is provided so as to be able to perform on/off control in response to a control signal CTLP.

The output of the input/output buffer 18 may be outputted to its corresponding external terminal of the SIP 102 through the corresponding terminal (third terminal) of the ASIC 100 as it is. Alternatively, an FF (Flip-Flop) 121 or the like may retain a detection signal.

An IO leak testing method using the input/output buffers 110 which receive the control signals will next be described with reference to FIG. 24. First, data is set to "0" or "1" from the chip (ASIC 100) side connected to the external terminals of the SIP 102, and the control signals CTLB1 and CTLB2 are respectively brought to an on state to thereby write data into portions (terminals 115 and 116) where an IO leak is detected. When the pull-up circuit 119 is provided at this time, the switch 120 is turned off in response to the control signal CTLP. When an output buffer 123 is provided on the SDRAM 101 side, as in the data signal 111, a control signal CS is brought to an off state even on the SDRAM 101 side.

When several power supply systems for the ASIC and SDRAM are provided in and are independently assigned to the external terminals, respectively, the output buffer of the SDRAM can be turned off by turning off the power supply on the SDRAM side, in the same manner as when the control signal CS is brought to an off state.

Next, the control signals CTLB1 and CTLB2 are brought to an off state to bring the terminals 115 and 116 into a high impedance state, respectively.

After a certain predetermined time has elapsed, the input buffer 118 reads data at charged portions (terminals 115 and 116) and outputs it to the outside of the ASIC 100. When, at this time, a leak of electrical charges occurs at the terminals 115 and 116, it produces a result different from an expected value. Thus, the presence or absence of an IO leak is determined.

When the system chip is in the form of an ASUC or CPU, the input/output buffer 110 which receives the control signals and its control circuit are generally inserted into the system chip as a BIST. However, it is also possible to make good use of the CS terminal for control on the side of a memory chip, such as a SDRAM or Flash memory, and insert a similar function.

Figure 25:
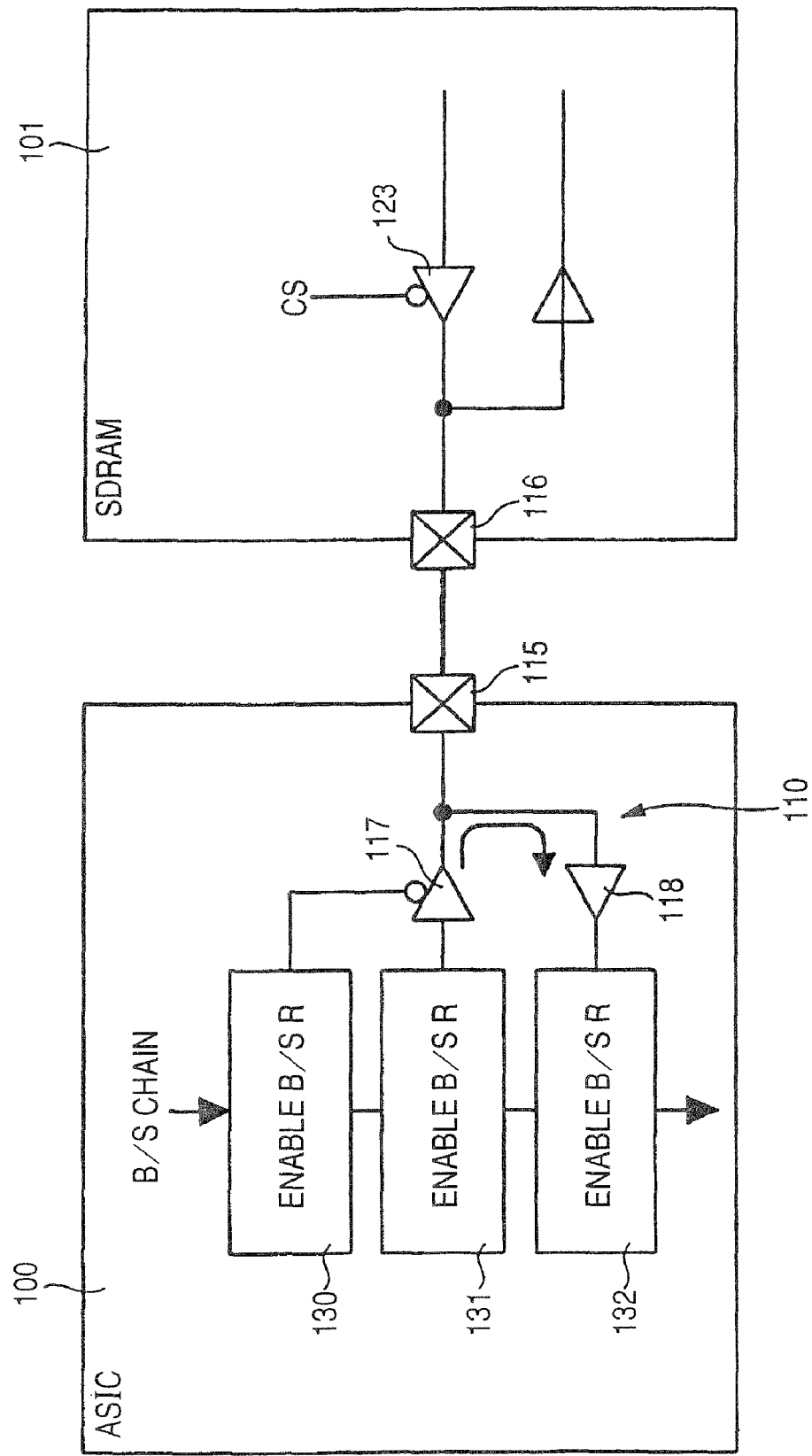
FIG. 25 is a schematic diagram showing a configuration based on a boundary scan system in the third embodiment of the present invention.

The input/output buffer 110 which receives the control signals and the control circuit thereof may be applied to a boundary scan test system. FIG. 25 shows a configuration as an example where they are applied to the boundary scan system. As shown in FIG. 25, a B/S chain comprising an enable B/SR (boundary scan register) 130, an output B/SR 131, an input B/SR 132, etc. is provided within an ASIC 100 and is connected to its corresponding input/output buffer 110 which receives a control signal. An IO leak test is performed using round intrusion of data from an output buffer 117 to an input buffer 18.

The size of the input/output buffer 110 with the control signal input can be rendered small according to its purpose, and, hence, a reduction in area can be realized.

A method for outputting the result of an IO leak test to the outside of the chip may be either a register (FF) type, such as the FF 121, or a through type for outputting the result thereof to the outside as it is. The result of the IO leak test can externally be detected by a tester. Accordingly, restraints on the circuit do not exist.

When the input/output buffer 110 which receives the control signal is mounted to the side of a general-purpose processor used as a system chip, this technique is applicable between the general-purpose processor and its corresponding memory (custom memory, function memory or the like).

Between the general-purpose processor and a custom processor, this technique is applicable to terminals used only in the inside, such as a data bus, a control signal, an SIO terminal, etc. according to specs.

Figure 26:
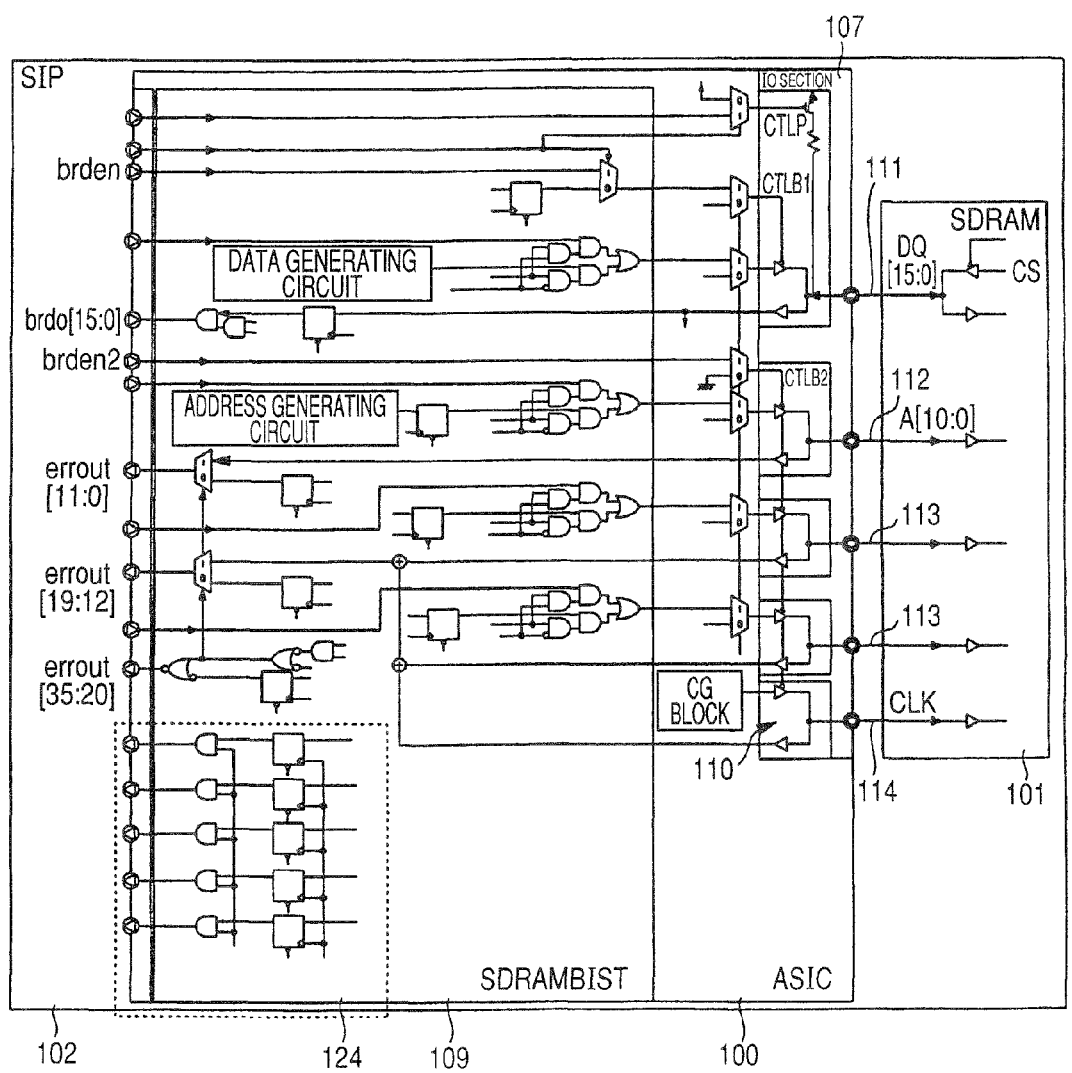
FIG. 26 is a schematic diagram illustrating the overall configuration of the semiconductor device according to the third embodiment of the present invention.

FIG. 26 shows an overall configuration as an example of an SIP 102 using input/output buffers 110 which receive control signals, according to the present embodiment. FIG. 26 shows where the input/output buffers 110 and a control circuit thereof are inserted into an ASIC 100 as a BIST. In FIG. 26, brden and brden2 indicate control signals for IO leak determination. While, brdo indicates an IO leak detection signal output of a register (FF) type, and errout indicates an IO leak detection signal output of a bypass (through mode) type. A SDRAMBIST 109 includes, in addition to an IO leak test circuit, a test circuit 124 which performs tests of the SDRAM 101 in a test mode, such as X-MARCH, Y-MARCH, a Pause test, a Disturb test, etc.

The details of an IO leak test using the input/output buffers 110, which are employed in the present embodiment, will next be explained.

Figure 27:
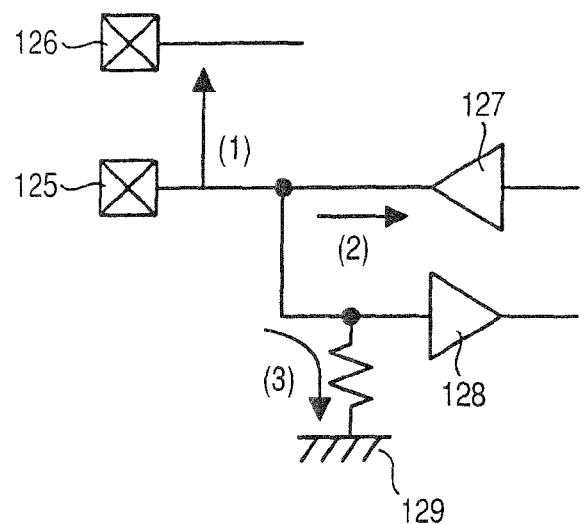
FIG. 27 is a schematic diagram showing the type of IO leakage at terminals (pins) of a semiconductor chip employed in the third embodiment of the present invention.

FIG. 27 is a view illustrating the type of IO leak which occurs at a terminal (pin) of a semiconductor chip. IO leaks at the pin 125 in the semiconductor chip include (1) a pin-to-pin leak, (2) an IO buffer leak and (3) a power supply/GND leak. The type (1) pin-to-pin leak is a leak between the terminal 125 and a pin 126 disposed adjacent thereto. The type (2) IO buffer leak is a leak for an output buffer 127 and an input buffer 128, which is caused by failures in transistors that constitute the output buffer 127 and the input buffer 128. The type (3) power supply/GND leak is a leak between a power supply and a GND (ground) 129.

To detect the type (1) pin-to-pin leak, data of '...0000"1"0000...' or '...1111"0"1111...' is written into each pin as a test pattern, for example, thereby making it possible to detect the leak. Incidentally, data of "1" or "0" indicates data at the pin 125 intended for detection.

Figure 28:
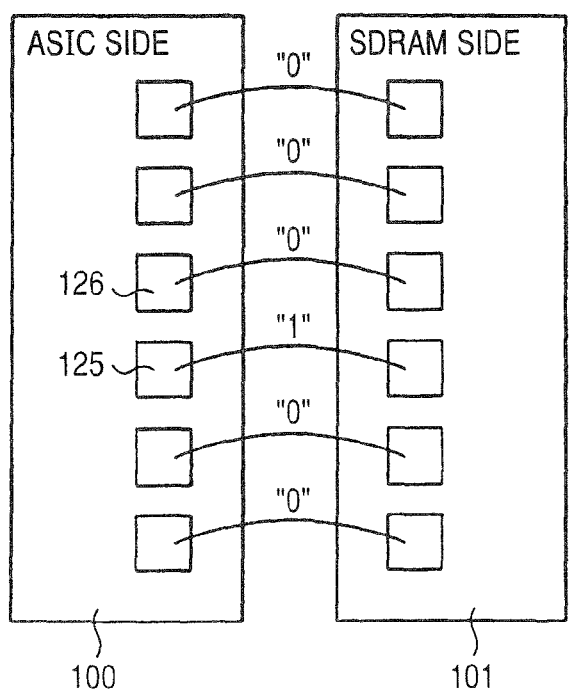
FIG. 28 is a diagram illustrating an IO leakage test method employed in the third embodiment of the present invention.

This condition is shown in FIG. 28. In FIG. 27, the pin to be subjected to leak detection is the pin 125. In this case, "1" is written into the pin 125, and "0" is written into the other pins, including the pin 126 adjacent thereto. That is, the data of the pin 125 intended for detection and the pin 126 adjacent thereto are inverted and charged or discharged, whereby a pin-to-pin leak can be detected.

In order to detect the type (2) IO buffer leak, data of '...XXXX"1"XXXX...' or '...XXXX"0"XXXX...' is charged or discharged to each pin as a test pattern, for example, thereby enabling the detection of the leak. Incidentally, data of "1" or "0" indicates data at the pin 125 intended for detection, while 'X' means that either the data of I/O may be used. That is, it is unrelated to data at the adjacent pin 126.

In order to detect the type (3) power supply/GND leak, data of '...XXXX"1"XXXX...' is charged to each pin as a test pattern, for example, thereby to enable leak detection for GND. Further, data of '...XXXX"0"XXXX...' is written into each pin to thereby enable leak detection for the power supply.

Thus, the following two patterns are effected on internally connected pins as test patterns for a mass production test of an SIP product.

'...0000"1"0000...': pin-to-pin leak and power supply VSS (GND) leak confirmation pattern '...1111"0"1111...': pin-to-pin leak and power supply VDD leak confirmation pattern Further, the following two patterns are used as test patterns for an efficient test.

'...1010"1"01010...adjacent pin-to-pin leak and power VSS (GND) leak confirmation pattern '...0101"0"10101....': adjacent pin-to-pin leak and power supply VDD leak confirmation pattern Supposing that the pin-to-pin leak occurs only at the adjacent pin, the IO leak can be detected by the two patterns.

Next, a description will be made of how to determine a predetermined time, in which, after a connecting terminal is charged or discharged by the corresponding input/output buffer 110 with the control signal input, the connecting terminal is brought into a high impedance state to be held for a predetermined time.

Figure 29:
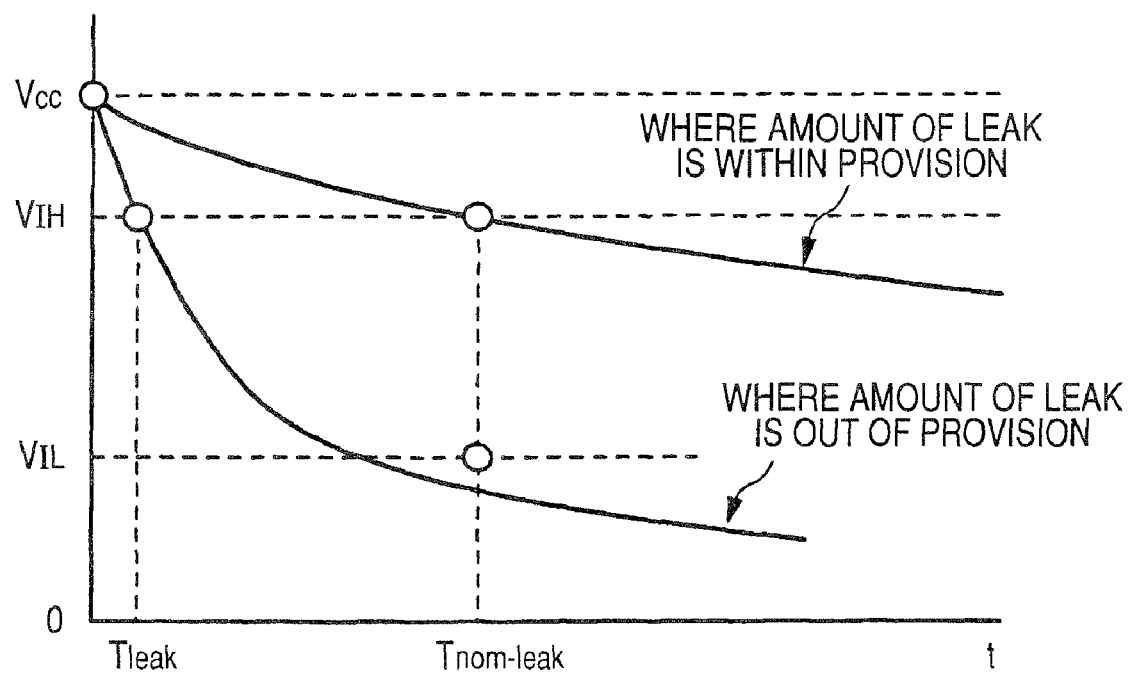
FIG. 29 is a graph showing time changes in voltage at a connecting terminal where the connecting terminal is charged to a voltage Vcc and thereafter brought into a high impedance state in the third embodiment of the present invention.

FIG. 29 is a view showing time changes in the voltage at a connecting terminal where the connecting terminal is charged to a voltage Vcc and thereafter brought into a high impedance state. In FIG. 29, the vertical axis indicates the voltage of the connecting terminal, and the horizontal axis indicates an elapsed time t. When the amount of a leak of the connecting terminal is within the specified value, the voltage at the connecting terminal is held at a high level (data "1") $V_{IH}$ or higher until the elapse of a time $T_{nom-leak}$. However, when the amount of the leak of the connecting terminal is out of the specified value, the high level (data "1") $V_{IH}$ can be held only for a time $T_{leak}$. When the time $T_{nom-leak}$ has elapsed, the voltage at the connecting terminal is brought into a low level (data "0") $V_{IL}$. Thus, the connecting terminal is charged to a voltage Vcc by the output buffer and thereafter brought into a high impedance state. After the elapse of the time $T_{nom-leak}$, the voltage at the connecting terminal is read by the input buffer, whereby a leak test can be carried out.

While the invention made by the present inventors has been described specifically on the basis of the preferred embodiments thereof, the present invention is not limited to the embodiments referred to above. It is needless to say that various changes can be made thereto within a scope not departing from the gist thereof.

Although first and second embodiments have described, for example, with reference to a case in which the two semiconductor chips of the microcomputer chip 3 and the SDRAM 2 are disposed side by side laterally in the semiconductor devices, semiconductor devices in a number greater than two may be disposed alongside each other. The number of semiconductor chips is not limited to two.

Although the first embodiment has been described, as an example, with reference to a case in which the semiconductor device is of the QFP type, the semiconductor device may be a QFJ (Quad Flat J-leaded Package) type or the like, and the shape of each lead is not limited.

Although the third embodiment has principally been described with reference to a case in which the invention made by the present inventors is applied to a semiconductor device in which a plurality of semiconductor chips, corresponding to the technical field to which the invention belongs, are mounted to a single package, the present invention is not limited to this. The present invention is applicable even to leak determination or the like where a plurality of semiconductor products are mounted to a packaging board, for example.

The present invention is suitable for use in electronic equipment and a semiconductor device, and its manufacturing method.

Further, the invention disclosed in the present application is applicable to a semiconductor device, such as an SIP, in which a plurality of semiconductor chips are mounted to a single package. The invention is greatly effective particularly for an SIP product that is required to have a low cost, for a small-area package SIP product, etc.

What is claimed is:

1. A method for manufacturing a semiconductor device, comprising the steps of:

(a) providing a lead frame comprising a chip mounting section, a plurality of suspension leads connecting to the chip mounting section, and a plurality of leads,
wherein the chip mounting section has an upper surface and a lower surface opposing to the upper surface;

(b) mounting a first semiconductor chip over a first area of the upper surface of the chip mounting section, wherein the first semiconductor chip has a first main surface, a first rear surface opposing to the first main surface, and a plurality of first pads formed on the first main surface;
(c) mounting a second semiconductor chip over a second area of the upper surface of the chip mounting section,
wherein the second semiconductor chip has a second main surface, a second rear surface opposing to the second main surface, and a plurality of second pads formed on the second main surface, and
wherein the second area is adjacent to the first area;
(d) disposing the chip mounting section on a heating jig such that the lower surface of the chip mounting section is supported by a surface of the heating jig,
wherein the surface of the heating jig is substantially flatly formed;

(e) electrically connecting the plurality of first pads of the first semiconductor chip with the plurality of second pads of the second semiconductor chip via a plurality of first wires, respectively;
(f) electrically connecting the plurality of first pads of the first semiconductor chip with the plurality of leads via a plurality of second wires, respectively;
(g) sealing the first semiconductor chip, the second semiconductor chip, the plurality of first wires and the plurality of second wires with resin such that a part of each of the plurality of leads is exposed from the resin; and
(e) separating each of the plurality of leads from the lead frame, wherein the semiconductor device comprises a Quad Flat Package.

\* \* \* \* \*